United States Patent [19]
Rubinstein

[11] Patent Number: 5,933,855
[45] Date of Patent: Aug. 3, 1999

[54] SHARED, RECONFIGURABLE MEMORY ARCHITECTURES FOR DIGITAL SIGNAL PROCESSING

[76] Inventor: Richard Rubinstein, 3418 NE. 83rd Ave., Vancouver, Wash. 98662

[21] Appl. No.: 08/821,326

[22] Filed: Mar. 21, 1997

[51] Int. Cl.[6] .................................................... G06F 12/00
[52] U.S. Cl. ................................. 711/200; 711/1; 711/5; 711/221
[58] Field of Search ................................ 711/1, 5, 200, 711/221

[56] References Cited

U.S. PATENT DOCUMENTS

| | | | |
|---|---|---|---|
| 4,984,205 | 1/1991 | Sugibayashi | 365/222 |
| 5,293,586 | 3/1994 | Yamazaki et al. | 345/519 |
| 5,301,295 | 4/1994 | Leary et al. | 711/125 |
| 5,313,413 | 5/1994 | Bhatia et al. | 364/726.06 |
| 5,412,740 | 5/1995 | Fadavi-Ardekani | 711/200 |
| 5,418,910 | 5/1995 | Siegel | 395/872 |
| 5,434,989 | 7/1995 | Yamaguchi | 711/118 |
| 5,515,329 | 5/1996 | Dalton et al. | 365/221 |
| 5,627,994 | 5/1997 | Levy et al. | 711/150 |

OTHER PUBLICATIONS

Barron and Higbie, Computer Architecture (Addison–Wesley, 1992) at pp. 196–204.

Cypress Semiconductor, Product Description CY7C604 Cache Controller and Memory Management Unit (CMU); Document #38–00091; pp. 6–13–6–16.

Integrated Device Technology, Inc., 32K×32 MCache Synchonous Pipelined Cache RAM; (1996); IDT71F432; pp. 13.1.1–5.

Integrated Device Technology, Inc., 256KB/512KB Pipelined Burst Fusion Memory Secondary Cache Modules; (Jul., 1996); IDT7MPV6204, 5, 6, 8; pp. 1–7.

Integrated Device Technology, Inc., High–Speed 16K×8 Dual–Port Static RAM; (1990); IDT7006S/L; pp. 1–21.

Integrated Device Technology, Inc., High–Speed 1K×8 Four–Port Static RAM; (1990); IDT7050L; pp. 1–11.

Integrated Device Technology, Inc., High–Speed 2K×8 Four–Port Static RAM; (1990); IDT7052; IDT7052L; pp. 1–11.

Integrated Device Technology, Inc., CMOS Static RAM 64K(4K ×16 IBT) Registered RAM w/SPC; (1990); IDT 70502S, IDT70502L; pp. 1–24.

Integrated Device Technology, Inc., High–Performance Fixed–Point Fast Fourier Transform Processor (1989); Application Note AN–23; pp. S–14–31–48.

Address Generation, DSP56002 Architecture and Addressing Modes, chap. 3.; pp. 66–70.

Address Generation, DSP56002 Architecture and Addressing Modes, chaps. 1–3.; pp. 22–77.

IEEE Journal of Solid–Sate Circuits, vol. 26, No. 12, Dec. 1991, A 300–MOPS Video Signal Processor with a Parallel Architecture, Toshihiro Minami, et al., pp. 1868–1875.

Texas Instruments, Advance Information, TMS44460, TMS46460, TMS46460P, 1048576–Word By 4–BIT Dynamic Random–Access Memories, Jun., 1995, pp. 4–5–4–6.

EE Times, NEC Turns Virtual Channel on Memory Latencies, Nov. 17, 1997, pp. 4–7.

Chilyon's ECN Magazine, Technological Horizons, Chris Webb, Cypress Semiconductor Corp., Nov., 1996, pp. 1–4.

Integrated Device Technology, Inc., 32K×32 CacheRAM with Interleaver/Linear Burst Counter; (Jul. 1996); IDT71V432; pp. 1–14.

*Primary Examiner*—John W. Cabeca
*Assistant Examiner*—Mehdi Namazi

[57] ABSTRACT

Architectures and circuits are described for various implementations of a memory-centric computing system for DSP and other compute-intensive applications. A shared, reconfigurable memory system is accessible to both a host processor or controller and to one or more execution units such as a DSP execution unit. By swapping memory space between the processor and the execution unit so as to support continuous execution and I/O, improved performance is achieved while cost is reduced. The shared memory system includes multiple reconfigurable memory segments to allow allocation of various amounts of memory to respective execution units or I/O or DMA channels as needed to optimize performance. A "virtual two-port" solution also is described for using single-port memory in the shared configuration with multiple address sources.

25 Claims, 27 Drawing Sheets

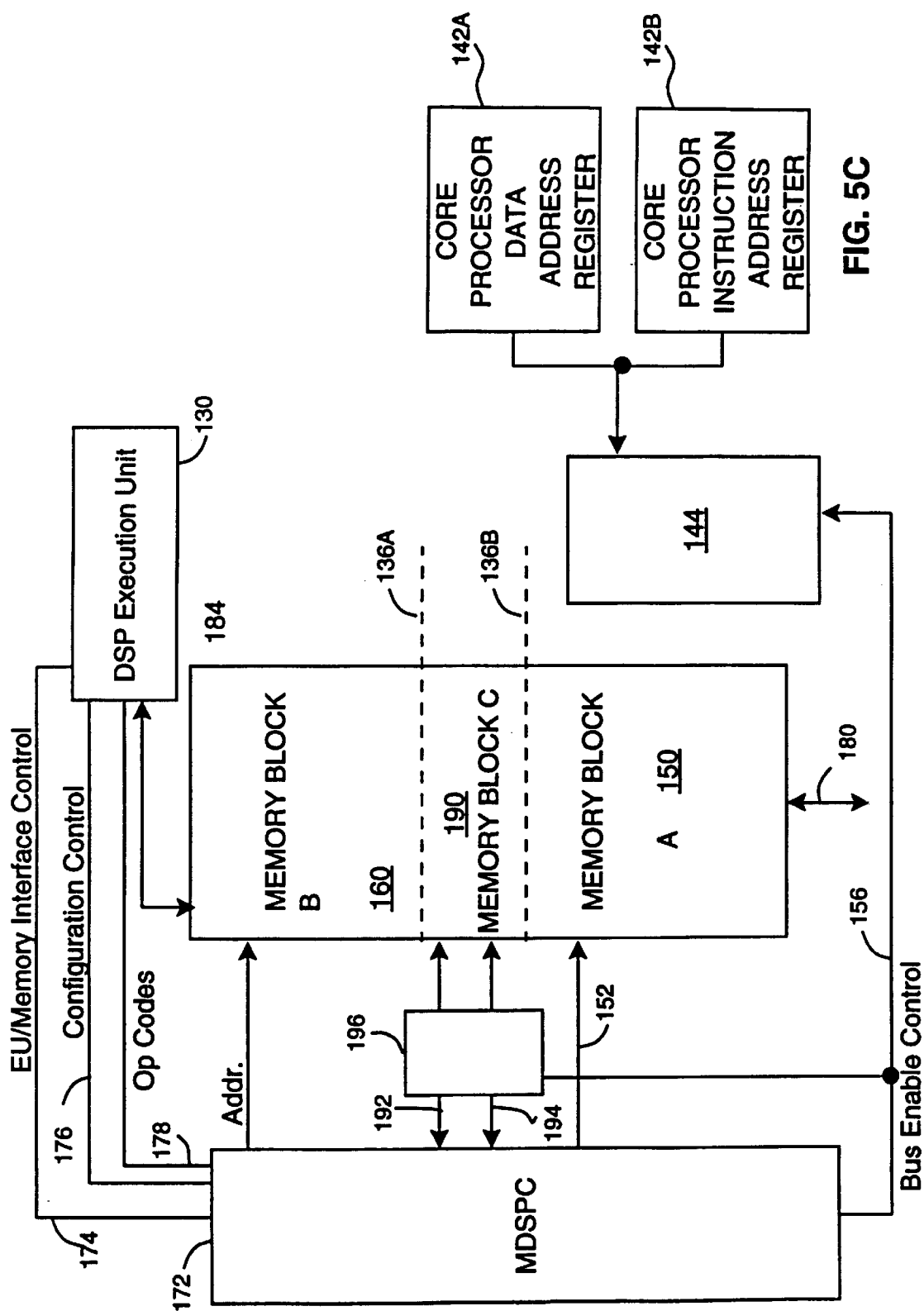

SHARED, RECONFIGURABLE MEMORY ARCHITECTURES FOR DIGITAL SIGNAL PROCESSING

FIELD OF THE INVENTION

The present invention is generally in the field of digital computer architectures and, more specifically, is directed to circuits, systems and methodologies for digital signal processing utilizing shared, reconfigurable memory elements.

BACKGROUND OF THE INVENTION

General purpose microprocessor cores are known for implementation into integrated circuits for a wide variety of applications. Digital Signal Processing (DSP) cores also are known for carrying out digital signal processing tasks. DSP cores are specially configured to efficiently process DSP algorithms. One example of a known DSP chip is the DSP 56002 processor, commercially available from Motorola. In order to achieve improved performance in DSP-related processing, the conventional approach is to combine a general purpose processor core together with a DSP core. The general purpose processor carries out Input/Output (I/O) tasks, logic functions, address generation, etc. This is a workable but costly solution. Additionally, evolving new applications require increasing amounts of memory and the use of multiple conventional digital signal processors. Additionally, power dissipation becomes a limiting factor in hardware of this type. The challenge, therefore, is to provide for improvements in digital signal processing performance while containing or reducing costs.

In view of the foregoing, one object of the present invention is to provide an improved computer architecture that utilizes available memory more efficiently in DSP systems. Another object is to reduce the power consumption and size of DSP systems.

A further object of the present invention is to provide for shared and reconfigurable memory in order to reduce I/O processor requirements for digital signal processing in processor and co-processor architectures. A further object is to extend a shared, reconfigurable memory architecture to multiple memory blocks and execution units.

Another object of the invention is utilization of novel "bit configuration tables" in connection with shared and reconfigurable memory to use memory more efficiently, and to improve performance by making new data continually available so that the execution unit is never idle. A further object of the invention is to provide improvements in memory addressing methods, architectures and circuits for continuous DSP execution together with simultaneous, continuous Direct Memory Access (DMA) operations.

A still further object of the invention is to provide improvements in execution units for DSP operations, for example execution unit architectures that feature deep-pipeline structures and local registers, and that support parallel operations. Modified execution units can be used to improve efficiency of operation in conjunction with reconfigurable memory.

Yet another object of the present invention is a "virtual two port" memory structure based on a conventional, single-port memory cell. Yet another object is to provide for implementation in both Static Random Access Memory (SRAM) and Dynamic Random Access Memory (DRAM) configurations of the virtual two-port memory.

SUMMARY OF THE INVENTION

In view of the foregoing background, the present invention is directed to improved hardware architectures for digital signal processing, and more specifically, is directed to "memory-centric" methods and apparatus for improved performance in digital signal processing or "DSP" systems. As mentioned above, improvements in DSP performance have been achieved by providing special arithmetic units or "execution units" that are optimized to carry out the arithmetic operations that are commonly required in DSP—mainly multiplication and addition—at very high speed. One example of such an execution unit is the "DAU" (data execution unit) provided in the WE DSP32C chip from AT&T. The AT&T execution unit, and others like it, provide relatively fast, floating point arithmetic operations to support computation-intensive applications such as speech, graphics and image processing.

While many improvements have been made in floating-point execution units, pipelined architectures, decreased cycle times, etc., known DSP systems generally work with standard memory systems. For example, DRAM integrated circuits are used for reading input data and, on the output side, for storing output data. DSP data is moved into and out of the DRAM memory systems using known techniques such as multiple-ported memory, DMA hardware, buffers, and the like. While such systems benefit from improvements in memory speed and density, data transfer remains a relative bottleneck. I have reconsidered these known techniques and discovered that significant gains in performance and flexibility can be achieved by focusing on the memory, in addition to the execution unit, and by providing improvements in methods and circuits for moving data efficiently among data sources (such as a host processor bus or I/O channel), memory subsystems, and execution units. Since the focus is on the memory, I coined the term "memory-centric" computing.

One aspect of the invention is a memory subsystem that is partitioned into two or more blocks of memory space. One block of the memory communicates with an I/O or DMA channel to load data, while the other block of memory simultaneously communicates with one or more execution units that carry out arithmetic operations on data in the second block. Results are written back to the second block of memory. Upon conclusion of that process, the memory blocks are effectively "swapped" so that the second block, now holding processed (output) data, communicates with the I/O channel to output that data, while the execution unit communicates with the first block, which by then has been filled with new input data. Methods and apparatus are shown for implementing this memory swapping technique in real time so that the execution unit is never idle.

Another aspect of the invention provides for interfacing two or more address generators to the same block of memory, so that memory block swapping can be accomplished without the use of larger multi-ported memory cells.

The present invention is useful in a wide variety of signal processing applications including programmable MPEG encode and decode, graphics, speech processing, image processing, array processors, etc. In telecommunications, the invention can be used, for example, for switching applications in which multiple I/O channels are operated simultaneously.

A further aspect of the invention provides for partitioning the memory space into two or more memory "segments"—with the ability to selectively assign one or more such segments to form a required block of memory. Thus, for example, one block of memory can be configured to include say, four segments, and be associated with an execution unit, while another block of memory is configured to include only one segment and may be assigned to an I/O or DMA channel. This flexibility is useful in matching the memory block size to the requirements of an associated execution unit for a particular operation, say a recursive type of digital filter such as an Infinite Impulse Response (IIR) filter. Memory segments can be of arbitrary size as will be shown in more detail later.

Importantly, the memory is readily "reconfigurable" so that it can adapt to the particular calculations required. Several implementations are disclosed herein. In one embodiment, the memory reconfiguration is controlled by configuration control signals. The configuration control signals may be generated based upon "configuration bits" which can be downloaded from a core processor, instruction decoder, or durable memory, for reconfiguring the memory responsive to the task at hand. In another arrangement, the configuration bits are stored in extended bit positions in the regular memory, so that pointers or traps can be used in software to reconfigure the hardware. A further aspect of the invention provides for generating configuration control signals in an improved address generator or in a novel Memory-centric DSP Controller ("MDSPC"). The new address generation techniques include both reconfiguring and addressing the memory to support a particular computation in the execution unit.

Another feature of the invention is that memory blocks can be reconfigured both in depth, i.e. number or words or rows, as well as in width (word size). This flexibility simplifies, and speeds, memory I/O for various applications, and provides great flexibility in a single DSP system, which can be implemented as a separate "co-processor" or "on-board" with a general purpose or other core processor. For example, the memory word size can be easily configured to match that of the I/O channel currently in use. The invention can be implemented in both von Neumann as well as Harvard architectures.

A further aspect of the invention, again directed to improvements in data flow, provides ways to interface multiple blocks of memory, in combination with one or more execution units. In some applications, parallel execution units can be used to advantage. Another aspect of the invention is a system that is readily configurable to take advantage of the available execution resources. The configuration bits described above also can include controls for directing data to and from multiple execution units as and when appropriate.

The invention further anticipates an execution unit that can be reconfigured in several ways, including selectable depth (number of pipeline stages) and width (i.e. multiple word sizes concurrently). Preferably the pipelined execution unit(s) includes internal register files with feedback. The execution unit configuration and operation also can be controlled by execution unit configuration control signals. The execution unit configuration control signals can be determined by "configuration bits" stored in the memory, or stored in a separate "configuration table". The configuration table can be downloaded by the host core processor, and/or updated under software control. Preferably, the configuration control signals are generated by the MDSPC controller mentioned above executing microcode. This combination of reconfigurable memory, together with reconfigurable execution units, and the associated techniques for efficiently moving data between them, provides an architecture that is highly flexible. Microcoded software can be used to take advantage of this architecture so as to achieve new levels of performance in DSP systems. Because the circuits described herein require only one-port or two-port memory cells, they allow higher density and the associated advantages of lowered power dissipation, reduced capacitance, etc. in the preferred integrated circuit embodiments, whether implemented as a stand-alone coprocessor, or together with a standard processor core, or by way of modification of an existing processor core design. An important feature of the architectures described herein is that they provide a tightly coupled relationship between memory and execution units. This feature provides the advantages of reducing internal interconnect requirements, thereby lowering power consumption. In addition, the invention provides for doing useful work on virtually all clock cycles. This feature minimizes power consumption as well.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 5A–5C illustrate selected address and control signals in a Processor Implementation of a DSP system, i.e. a complete DSP system integrated on a single chip.

DETAILED DESCRIPTION OF A PREFERRED EMBODIMENT

FIG. 1

Figure 1:
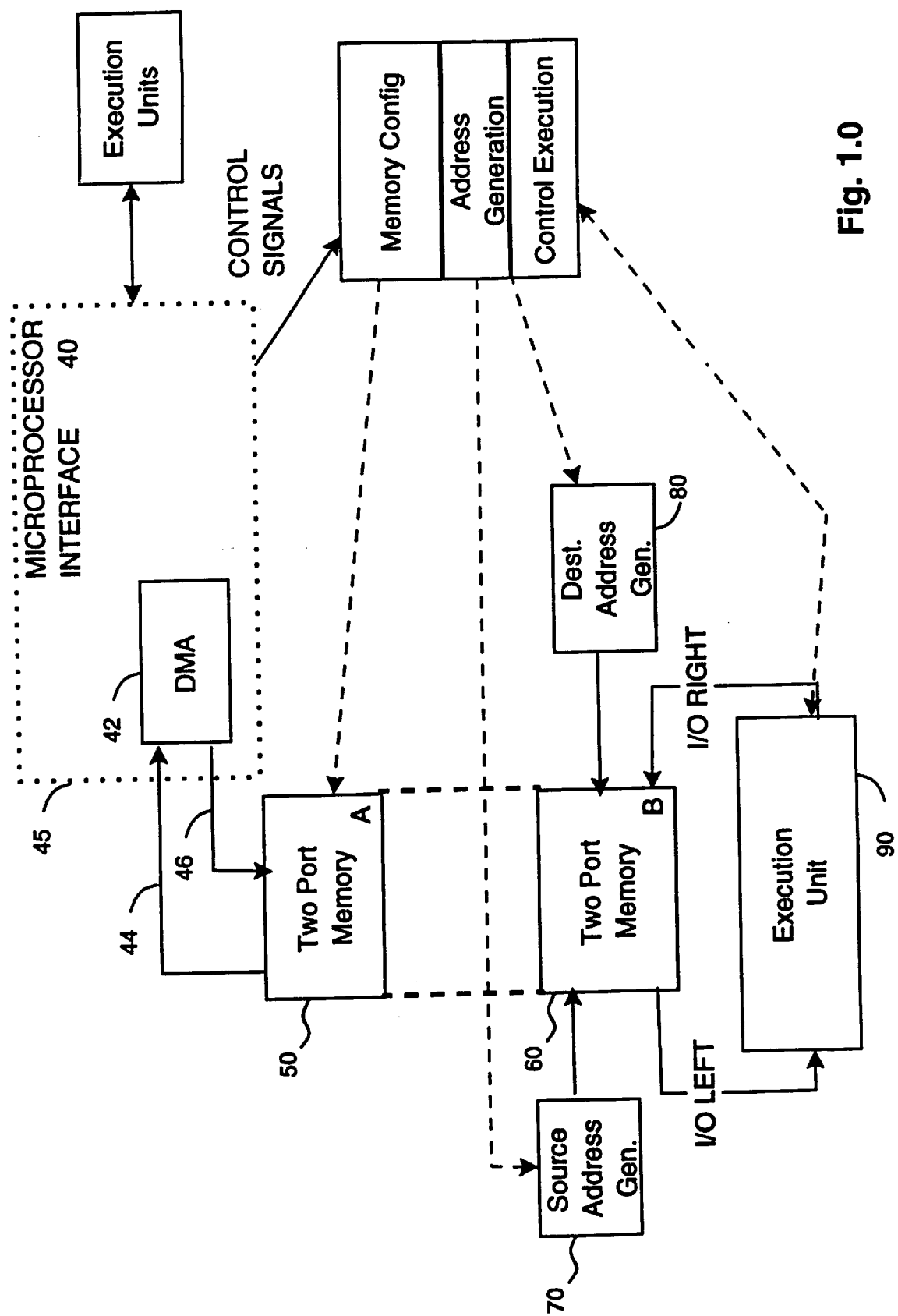
FIG. 1 is a system level block diagram of an architecture for digital signal processing (DSP) using shared memory according to the present invention.

FIG. 1 is a system-level block diagram of an architecture for memory and computing-intensive applications such as digital signal processing. In FIG. 1, a microprocessor interface 40 includes a DMA port 42 for moving data into a memory via path 46 and reading data from the memory via path 44. Alternatively, a single, bidirectional port could be used. The microprocessor interface 40 generically represents an interface to any type of controller or microprocessor. The interface partition indicated by the dashed line 45 in FIG. 1 may be a physical partition, where the microprocessor is in a separate integrated circuit, or it can merely indicate a functional partition in an implementation in which all of the memory and circuitry represented in the diagram of FIG. 1 is implemented on board a single integrated circuit. Other types of partitioning, use of hybrid circuits, etc., can be used. The microprocessor interface (DMA 42) also includes control signals indicated at 52. The microprocessor or controller can also provide microcode (not shown) for memory control and address generation, as well as control signals for configuration and operation of the functional execution units, as described later.

Because the present invention may be integrated into an existing processor or controller core design, so that both the core processor and the present invention reside in the same integrated circuit, reference will be made herein to the core processor meaning the processor that the present invention has been attached to or integrated with.

In FIG. 1, a two-port memory comprises the first memory block 50, labeled "A" and a second memory block 60, labeled "B." The memory is addressed by a source address generator 70 and a destination address generator 80. A functional execution unit 90 also is coupled to the two-port memory, left and right I/O channels, as illustrated at block B. Preferably, these are not conventional two-port memory I/O ports; rather, they have novel structures described later.

In operation, the interface 44, 46 to the two-port memory block A is a DMA interface that is in communication with the host processor or controller 40. Block A receives data coefficients and optionally other parameters from the controller, and also returns completed data to the controller that results from various DSP, graphics, MPEG encode/decode or other operations carried out in the execution unit 90. This output data can include, for example, FFT results, or convolution data, or graphics rendering data, etc. Thus the single memory can alternately act as both a graphics frame buffer and a graphics computation buffer memory.

Concurrently, the memory block "B" (60) interfaces with the functional execution unit 90. The functional execution unit 90 receives data from the two-port memory block B and executes on it, and then returns results ("writeback") to the same two-port memory structure. The source address generator 70 supplies source or input data to the functional execution unit while the destination address generator 80 supplies addresses for writing results (or intermediate data) from the execution unit to the memory. Put another way, source address generator 70 provides addressing while the functional execution unit is reading input data from memory block B, and the destination address generator 80 provides addressing to the same memory block B while the functional execution unit 90 is writing results into the memory.

As mentioned above, when the execution unit has completed its work on the data in block B, the memory effectively "swaps" blocks A and B, so that block B is in communication with the DMA channel 42 to read out the results of the execution. Conversely, and simultaneously, the execution unit proceeds to execute on the new input data in block A. This "swapping" of memory blocks includes several aspects, the first of which is switching the memory address generator lines so as to couple them to the appropriate physical block of memory.

In an alternative embodiment, the system can be configured so that the entire memory space (blocks A and B in the illustration) are accessed first by an I/O channel, and then the entire memory swapped to be accessed by the processor or execution unit. In general, any or all of the memory can be reconfigured as described. The memory can be SRAM, DRAM or any other type of random access semiconductor memory or functionally equivalent technology. DRAM refresh is provided by address generators, or may not be required where the speed of execution and updating the memory (access frequency) is sufficient to obviate refresh.

FIG. 2

Figure 2:
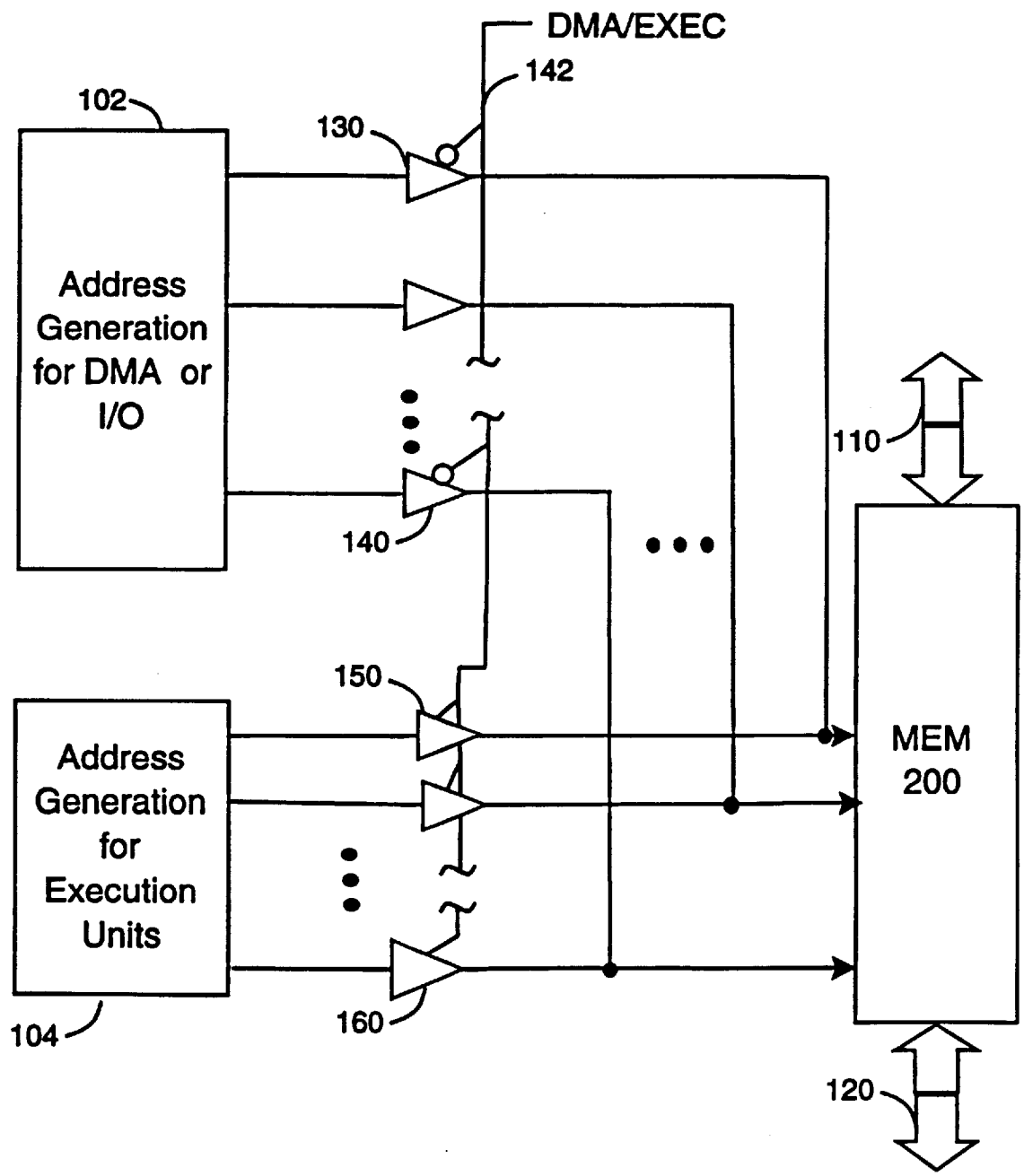
FIG. 2 illustrates circuitry for selectively coupling two or more address generators to a single block of memory.

FIG. 2 illustrates one way of addressing a memory block with two (or more) address generators. Here, one address generator is labeled "DMA" and the other "ADDR GEN" although they are functionally similar. As shown in FIG. 2, one of the address generators 102 has a series of output lines, corresponding to memory word lines. Each output line is coupled to a corresponding buffer (or word line driver or the like), 130 to 140. Each driver has an enable input coupled to a common enable line 142. The other address generator 104 similarly has a series of output lines coupled to respective drivers 150 to 160. The number of word lines is at least equal to the number of rows of the memory block 200. The second set of drivers also have enable inputs coupled to the common enable control line 142, but note the inverter "bubbles" on drivers 130 to 140, indicating the active-low enables of drivers 150 to 160. Accordingly, when the control line 142 is low, the DMA address generator 102 is coupled to the memory 200 row address inputs. When the control line 142 is high, the ADDR GEN 104 is coupled to the memory 200 row address inputs. In this way, the address inputs are "swapped" under control of a single bit. Alternative circuitry can be used to achieve the equivalent effect. For example, the devices illustrated can be tri-state output devices, or open collector or open drain structures can be used where appropriate. Other alternatives include transmission gates or simple pass transistors for coupling the selected address generator outputs to the memory address lines. The same strategy can be extended to more than two address sources, as will be apparent to those skilled in the art in view of this disclosure.

FIG. 3

Figure 3:
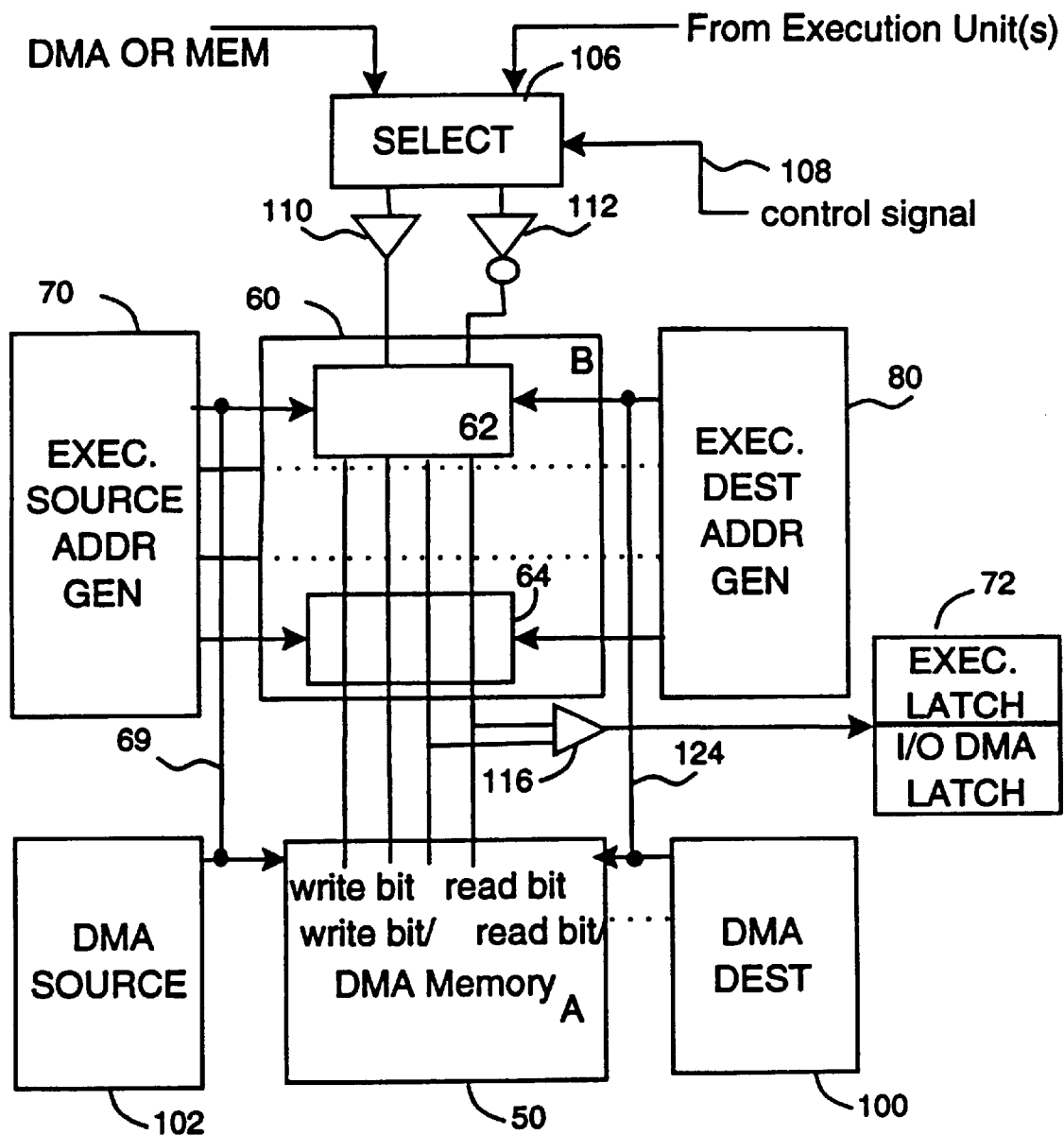
FIG. 3 is a block diagram illustrating portions of the memory circuitry and address generators of FIG. 1 in a fixed-partition memory configuration.

FIG. 3 is a block diagram illustrating a physical design of portions of the memory circuitry and address generators of FIG. 1 in a fixed-partition configuration. By "fixed partition" I mean that the size of memory block A and the size of memory block B cannot change dynamically. In FIG. 3, the memory block A (50) and block B (60) correspond to the same memory blocks of FIG. 1. The memory itself preferably is dynamic RAM, although static RAM or other solid state memory technologies could be used as well. In memory block B, just two bits or memory cells 62 AND 64 are shown by way of illustration. In a typical implementation, the memory block is likely to include thousands or even millions of rows, each row (or word) being perhaps 64 or more bits wide. A typical memory block using today's technology is likely to be one or two megabytes. The memory blocks need not be of equal size. Neither memory depth nor word size is critical to the invention.

Two bits are sufficient here to illustrate the concept without unduly complicating the drawing. The source address generator 70 is coupled to both memory blocks A and B. In block B, the top row includes a series of cells including bit cell 62. In fact, the source address generator preferably has output lines coupled to all of the rows of not only block B, but block A as well, although only one row line is illustrated in block A. Note also that corresponding address lines from the AG 70 and the DMA 102 are shown as connected in common, e.g. at line 69. However, in practice, these address lines are selectable as described above with reference to FIG. 2.

A destination address generator 80 similarly is coupled to the row lines of both blocks of memory. Memory cells 62 and 64 are full two-ported cells on the same column in this example. Thus, either source AG 70 or DMA 102 address the left port, while either destination AG 80 or DMA 100 address the right port. A write select multiplexer 106 directs data either from the DMA (42 in FIG. 1) (or another block of memory) or from the execution unit 90, responsive to a control signal 108. The control signal is provided by the controller or microprocessor of FIG. 1, by a configuration bit, or by an MDSPC. The selected write data is provided to column amplifiers 110, 112 which in turn are connected to corresponding memory cell bit lines. 110 and 112 are bit and/bit ("bit bar") drivers. Below cell 64 is a one-bit sense amplifier 116. A bit output from the sense amp 116 is directed, for example, to a latch 72. Both the DMA and the execution unit are coupled to receive data from latch 72, depending on apropriate control, enable and clock signals (not shown here). Or, both the DMA and the execution path may have separate latches, the specifics being a matter of design choice. Only one sense amp is shown for illustration, while in practice there will be at least one sense amp for each column. Use of multiple sense amps is described later.

FIG. 4

Figure 4:
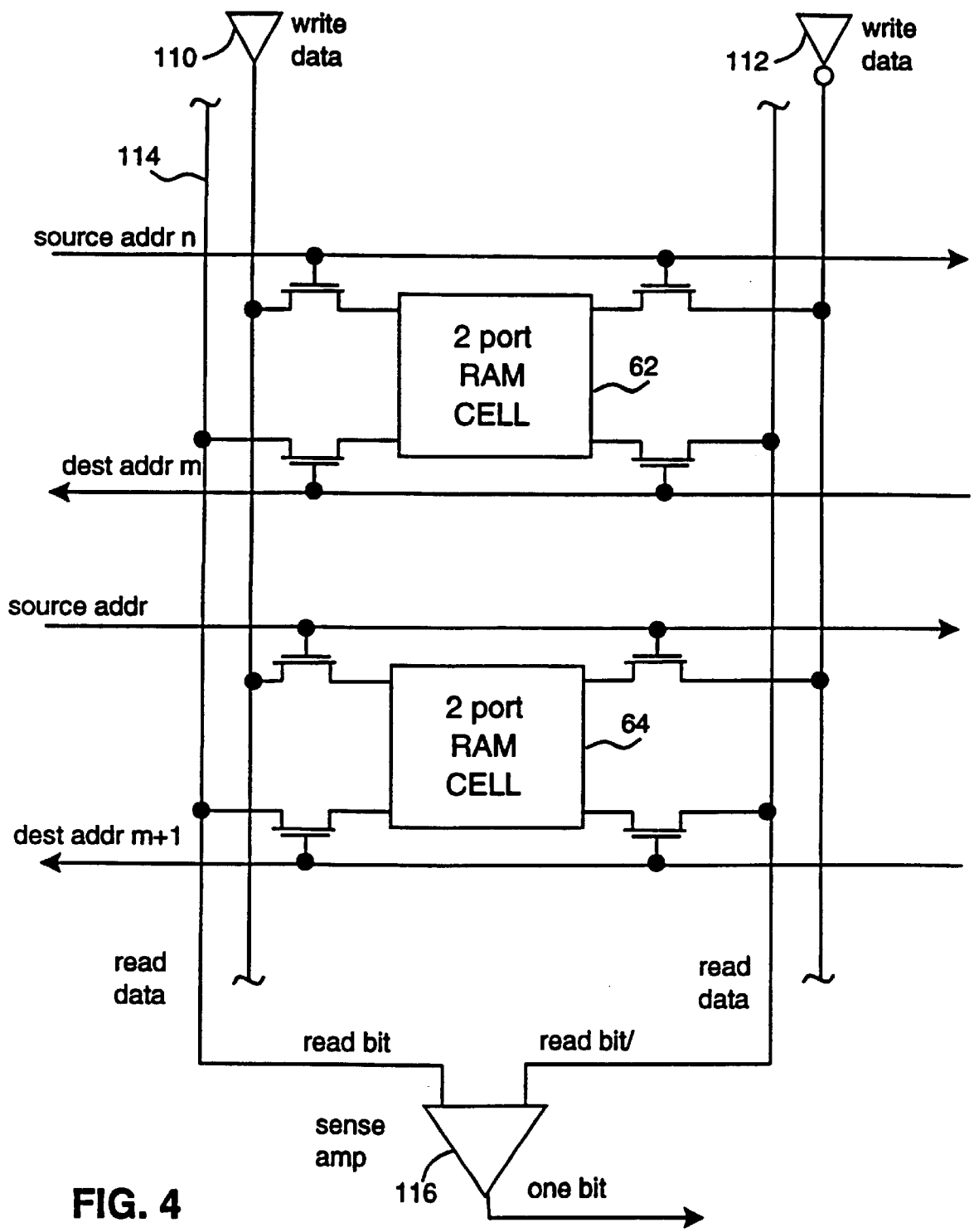
FIG. 4 shows more detail of address and bit line connections in a two-port memory system of the type described.

FIG. 4 shows more detail of the connection of cells of the memory to source and destination address lines. This drawing shows how the source address lines (when asserted) couple the write bit line and its complement, i.e. input lines 110,112 respectively, to the memory cells. The destination address lines couple the cell outputs to the read bit lines 114, 115 and thence to sense amp 116. Although only one column is shown, in practice write and read bit lines are provided for each column across the full width of the memory word. The address lines extend across the full row as is conventional.

Figure 21:
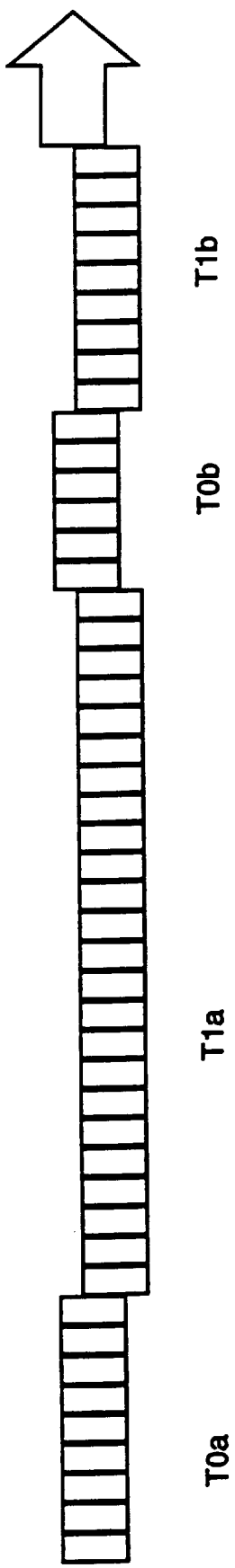
FIG. 21 is a timing diagram illustrating memory swapping cycles.
Figure 22A:
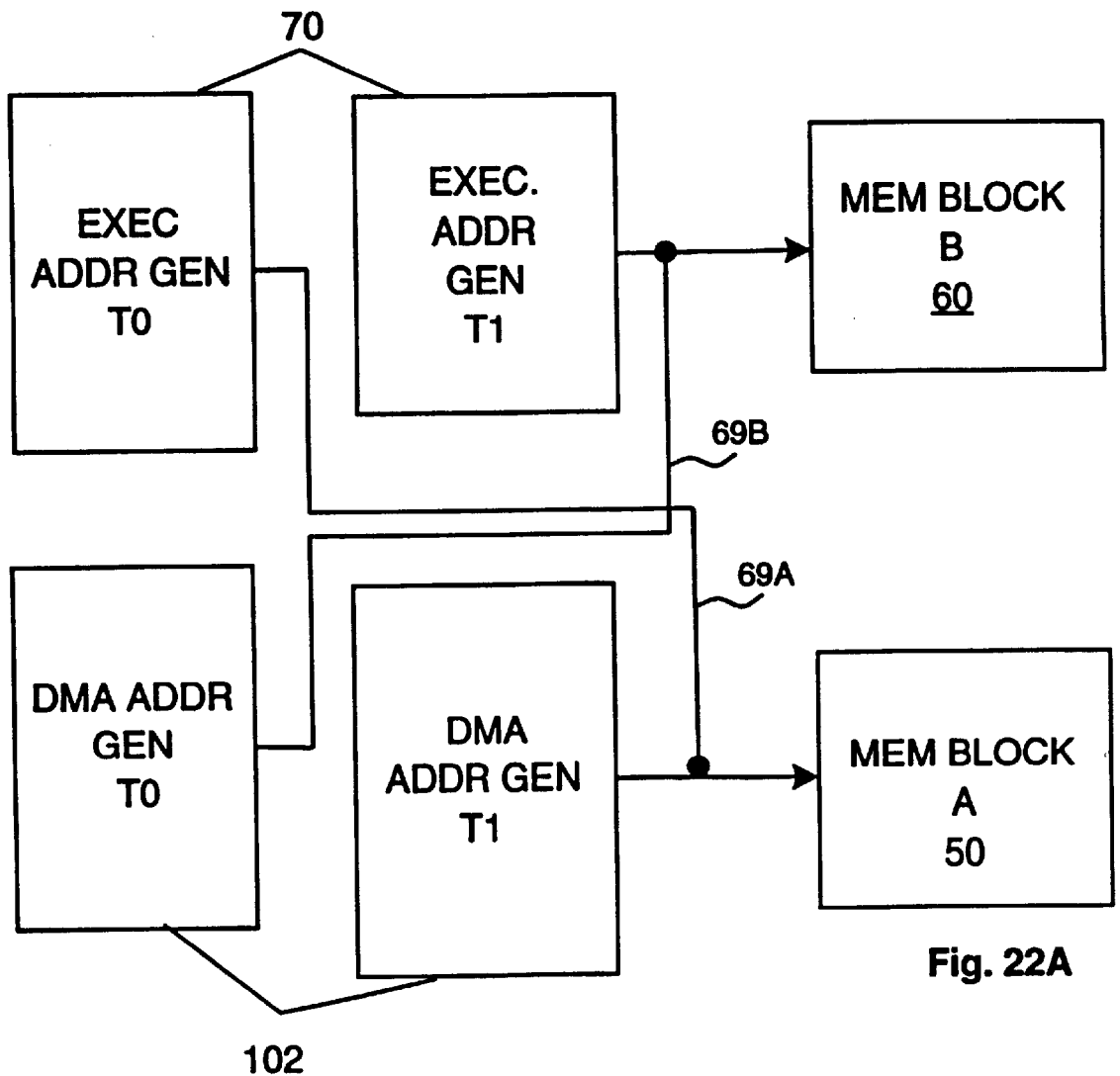
FIG. 22A is a block diagram illustrating memory swapping under bit table control.
Figure 22B:
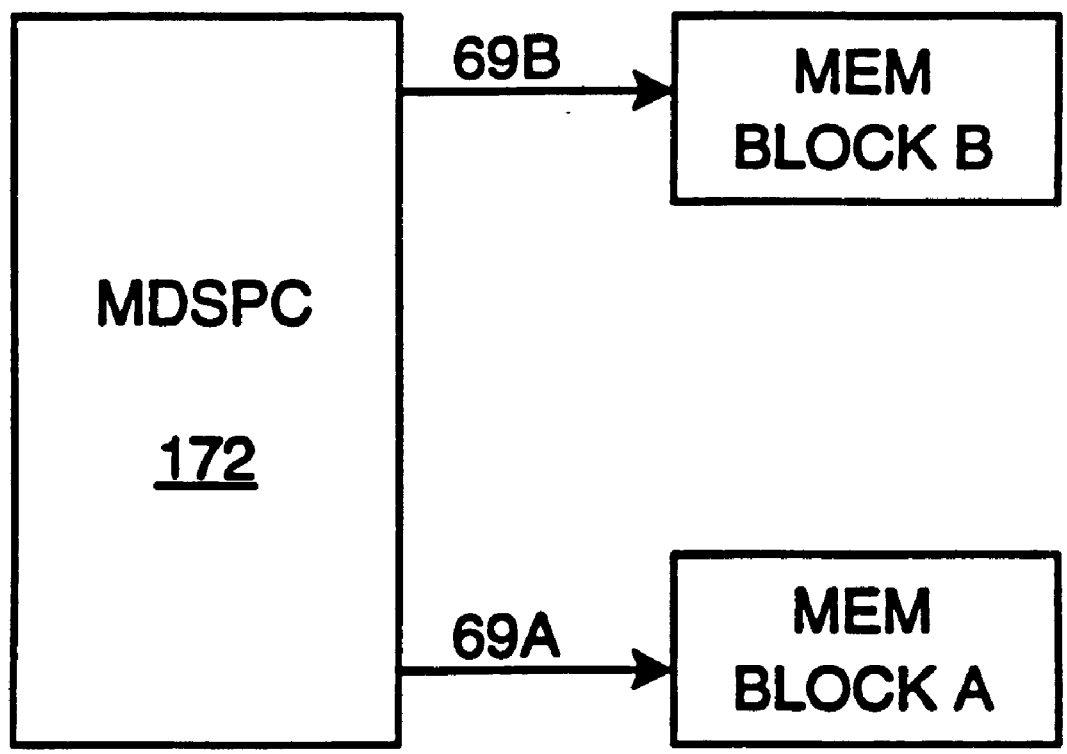
FIG. 22B is a block diagram illustrating memory swapping under MDSPC control.

FIGS. 21, 22A and 22B

Timing

FIG. 21 is a conceptual diagram illustrating an example for the timing of operation of the architecture illustrated in FIG. 1. T0A, T1A, etc., are specific instances of two operating time cycles T0 and T1. The cycle length can be predetermined, or can be a parameter downloaded to the address generators. T0 and T1 are not necessarily the same length and are defined as alternating and mutually exclusive, i.e. a first cycle T1 starts at the end of T0, and a second cycle T0 starts at the end of the first period T1, and so on. Both T0 and T1 are generally longer than the basic clock or memory cycle time.

FIG. 22A is a block diagram of a single port architecture which will be used to illustrate an example of functional memory swapping in the present invention during repeating T0 and T1 cyles. Execution address generator 70 addresses memory block A (50) during T0 cycles. This is indicated by the left (T0) portion of AG 70. During T1 cycles, execution address generator 70 addresses memory block B (60), as indicated by the right portion of 70. During T1, AG 70 also receives setup or configuration data in preparation for again addressing Mem Block A during the next T0 cycle. Similary, during T0, AG 70 also receives configuration data in preparation for again addressing Mem Block B during the next T1 cycle.

DMA address generator 102 addresses memory block B (60) during T0 cycles. This is indicated by the left (T0) portion of DMA AG 102. During T1 cycles, DMA address generator 102 addresses memory block A (50), as indicated by the right portion of 102. During T1, DMA AG 102 also receives setup or configuration data in preparation for again addressing Mem Block B during the next T0 cycle. Similary, during T0, DMA 102 also receives configuration data in preparation for again addressing Mem Block A during the next T1 cycle.

During a T0 cycle, the functional execution unit (90 in FIG. 1) is operating continuously on data in memory block A 50 under control of execution address generator 70. Simultaneously, DMA address generator 102 is streaming data into memory block B 60.

At the beginning of a T1 cycle, memory blocks A and B effectively swap such that execution unit 90 will process the data in memory block B 60 under control of execution address generator 70 and data will stream into memory block A 50 under control of DMA address generator 102. Conversely, at the beginning of a T0 cycle, memory blocks A and B again effectively swap such that execution unit 90 will process the data in memory block A 50 under control of execution address generator 70 and data will stream into memory block B 60 under control of DMA address generator 102.

In FIG. 22B, the functions of the execution address generator and DMA address generator are performed by the MDPSC 172 under microcode control.

FIGS. 5A–C

Processor Implementation

Figure 5A:
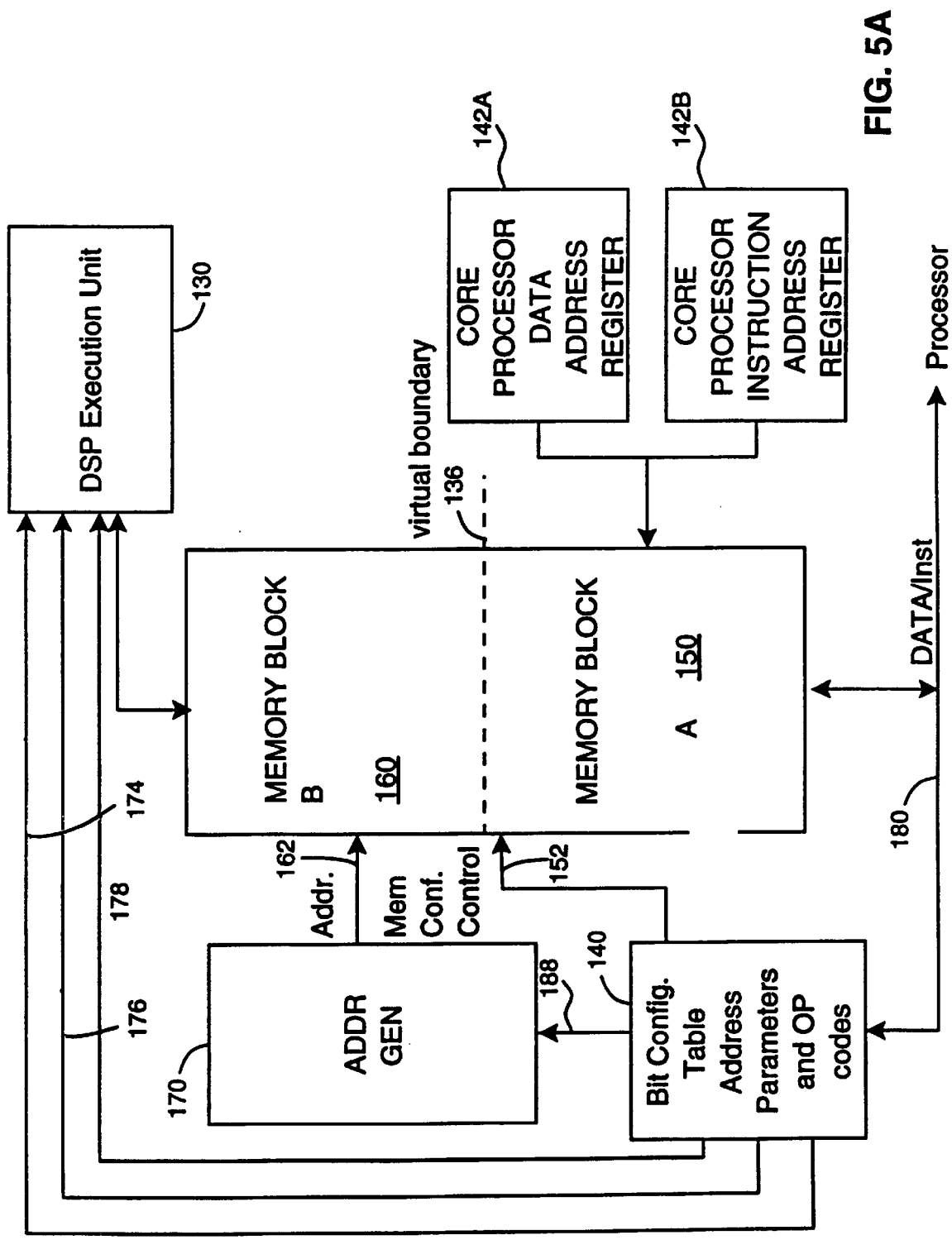
Figure 5B:
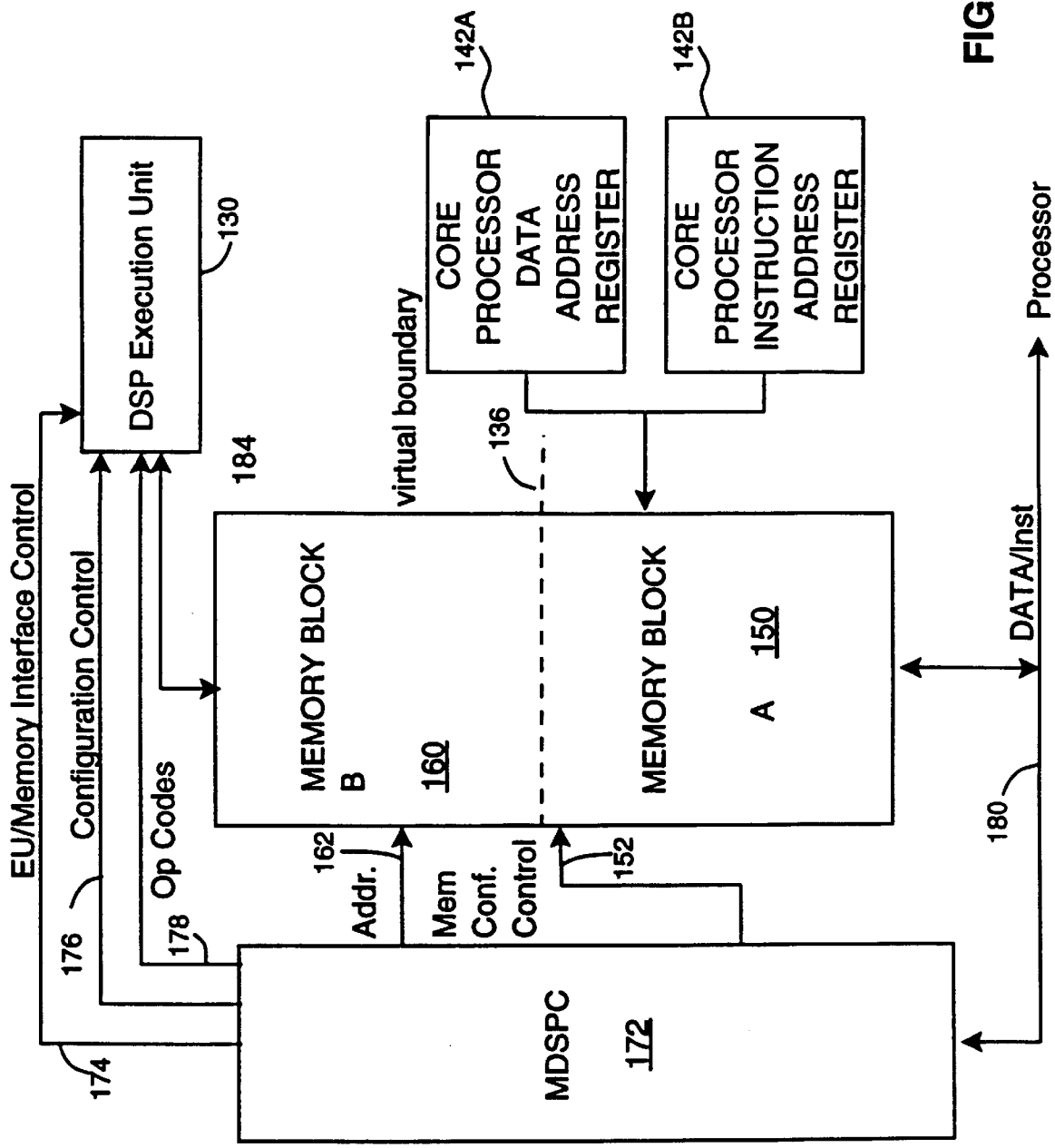

The preferred architecture for implementation in a processor application, as distinguished from a coprocessor application, is illustrated in FIGS. 5A–C. In FIG. 5A, a two-port memory again comprises a block A (150) and a block B (160). Memory block B is coupled to a DSP execution unit 130. An address generator 170 is coupled to memory block B 160 via address lines 162. In operation, as before, the address generator unit is executing during a first cycle T0 and during time T0 is loading parameters for subsequent execution in cycle T1. The lower memory block A is accessed via core processor data address register 142A or core processor instruction address register 142B. Thus, in this illustration, the data memory and the instructional program memory are located in the same physical memory. A microprocessor system of the Harvard architecture has separate physical memory for data and instructions. The present invention can be used to advantage in the Harvard architecture environment as well, as described below with reference to FIGS. 7A and 7B.

Bit Configuration Tables

FIG. 5A also includes a bit configuration table 140. The bit configuration table can receive and store information from the memory 150 or from the core processor, via bus 180, or from an instruction fetched via the core processor instruction address register 142B. Information is stored in the bit configuration table during cycle T0 for controlling execution during the next subsequent cycle T1. The bit configuration table can be loaded by a series of operations, reading information from the memory block A via bus 180 into the bit configuration tables. This information includes address generation parameters and opcodes. Examples of some of the address parameters are starting address, modulo-address counting, and the length of timing cycles T0 and T1. Examples of op codes for controlling the execution unit are the multiply and accumulate operations necessary for to perform an FFT.

Essentially, the bit configuration table is used to generate configuration control signal 152 which determines the position of virtual boundary 136 and, therefore, the configuration of memory blocks A and B. It also provides the configuration information necessary for operation of the address generator 170 and the DSP execution unit 130 during the T1 execution cycle time. Path 174 illustrates the execution unit/memory interface control signals from the bit configuration table 140 to the DSP execution unit 130. Path 176 illustrates the configuration control signal to the execution unit to reconfigure the execution unit. Path 178 illustrates the op codes sent to executionunit 130 which cause execution unit to perform the operations necessary to process data. Path 188 shows configuration information loaded from the configuration tables into the address generator 170.

The architecture illustrated in FIG. 5A preferably would utilize the extended instructions of a given processor architecture to allow the address register from the instruction memory to create the information flow into the bit configuration table. In other words, special instructions or extended instructions in the controller or microprocessor architecture can be used to enable this mechanism to operate as described above. Such an implementation would provide tight coupling to the microprocessor architecture.

Memory-centric DSP Controller

FIG. 5B illustrates an embodiment of the present invention wherein the functions of address generator 170 and bit configuration table 140 of FIG. 5A are performed by memory-centric DSP controller (MDSPC) 172. In the embodiment shown in FIG. 5B, the core processor writes microcode for MDSPC 172 along with address parameters into memory block B 150. Then, under core processor control, the microcode and address parameters are downloaded into local memory within MDSPC 172.

A DSP process initiated in MDPSC 172 then generates the appropriate memory configuration control signals 152 and execution unit configuration control signals 176 based upon the downloaded microcode to control the position of virtual boundary 136 and structure execution unit 130 to optimize performance for the process corresponding to the microcode. As the DSP process executes, MDSPC 172 generates addresses for memory block B 160 and controls the execution unit/memory interface to load operands from memory into the execution unit 130 which are then processed by execution unit 130 responsive to op codes 178 sent from MDSPC 172 to execution unit 130. In addition, virtual boundary 136 may be adjusted responsive to microcode during process execution in order to dynamicly optimize the memory and execution unit configurations.

In addition, the MDSPC 172 supplies the timing and control for the interfaces between memory and the execution unit. Further, algorithm coefficients to the execution unit may be supplied directly from the MDSPC. The use of microcode in the MDSPC results in execution of the DSP process that is more effecient than the frequent downloading of bit configuration tables and address parameters associated with the architecture of FIG. 5A. The microcoded method represented by the MDSPC results in fewer bits to transfer from the core processor to memory for the DSP process and less frequent updates of this information from the core processor. Thus, the core processor bandwidth is conserved along with the amount of bits required to store the control information.

FIG. 5C illustrates an embodiment of the present invention wherein the reconfigurability of memory in the present invention is used to allocate an additional segment of memory, memory block C 190, which permits MDPSC 172 to execute microcode and process address parameters out of memory block C 190 rather than local memory. This saves the time required for the core processor controlled download of microcode and address parameters to local memory in MDSPC 172 that takes place in the embodiment of FIG. 5B. This embodiment requires an additional set of address 192 and data 194 lines to provide the interface between memory block C 190 and MDSPC 172 and address bus control circuitry 144 under control of MDSPC 172 to disable the appropriate address bits from core processor register file 142. This configuration permits simultaneous access of MDSPC 172 to memory block C 190, DSP execution unit 130 to memory block B and the core processor to memory block A.

Similar to the embodiments shown in FIGS. 5A and 5B, virtual boundaries 136A and 136B are dynamically reconfigurable to optimize the memory configuration for the DSP process executing in MDSPC 172.

The bit tables and microcode discussed above may alternatively reside in durable store, such as ROM or flash memory. The durable store may be part of memory block A or may reside outside of memory block A wherein the content of durable store is transferred to memory block A or to the address generators or MDSPC during system initialization.

Furthermore, the DSP process may be triggered by either decoding a preselected bit pattern corresponding to a DSP function into an address in memory block A containing the bit tables or microcode required for execution of the DSP function. Yet another approach to triggering the DSP process is to place the bit tables or microcode for the DSP function at a particular location in memory block A and the DSP process is triggered by the execution of a jump instruction to that particular location. For instance, at system initialization, the microcode to perform a DSP function, such as a Fast Fourier Transform (FFT) or IIR, is loaded beginning at a specific memory location within memory block A. Thereafter, execution of a jump instruction to that specific memory location causes execution to continue at that location thus spawning the DSP process.

Figure 6A:
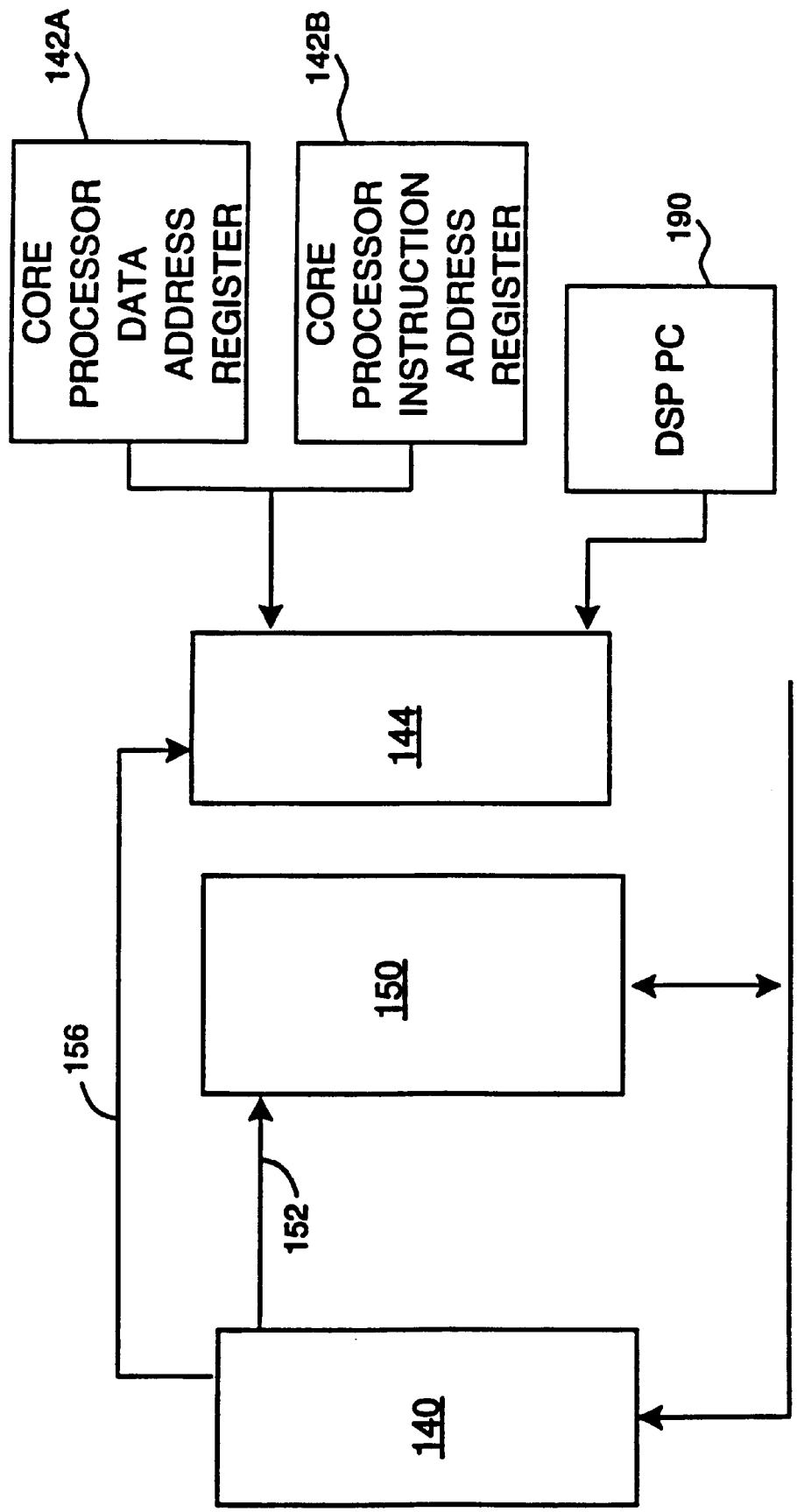
FIG. 6A illustrates an alternative embodiment in which a separate DSP program counter is provided for accessing the memory.
Figure 6B:
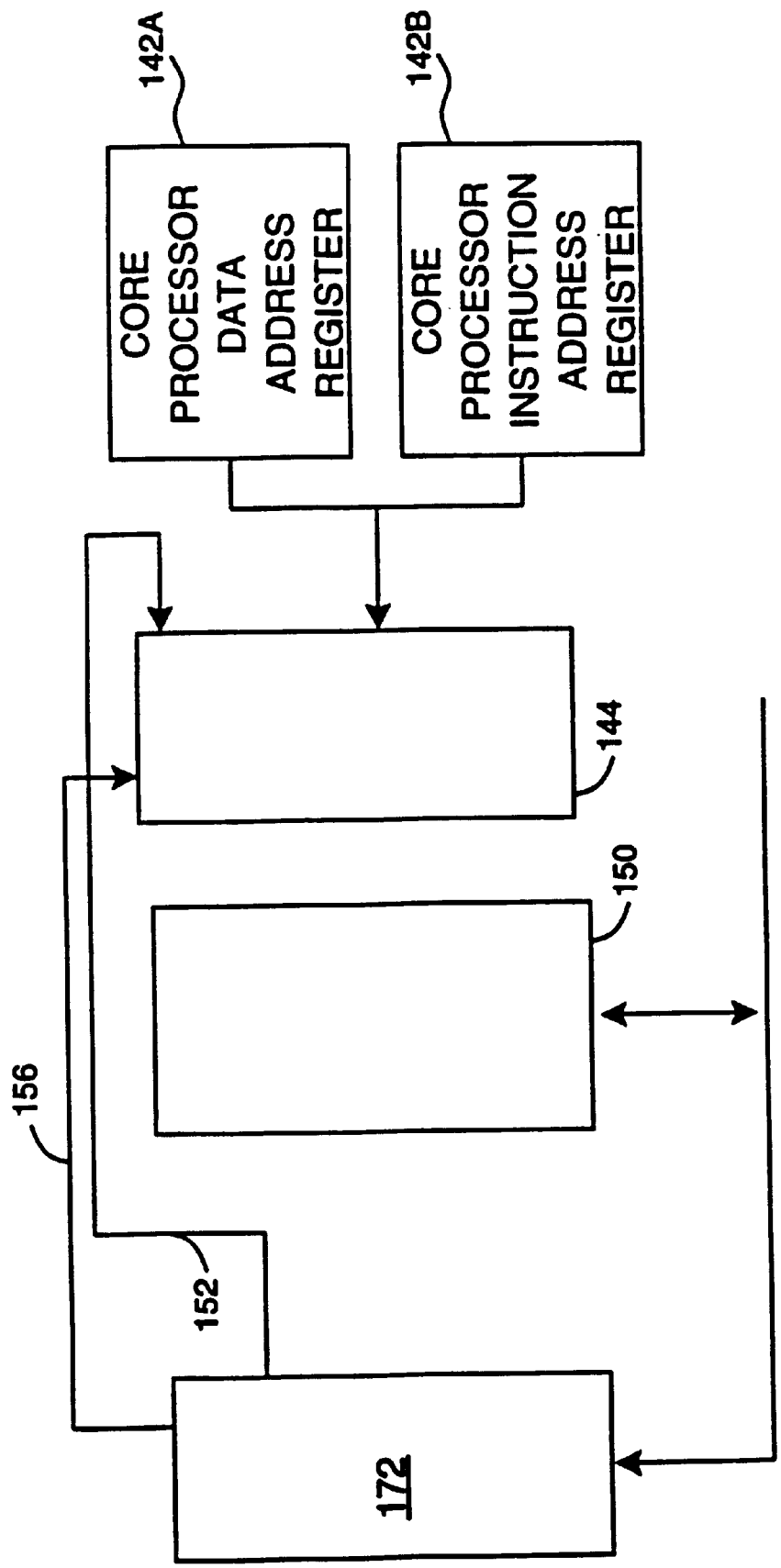
FIG. 6B illustrates an alternative embodiment in which an MDSPC accesses the memory.

FIGS. 6A and 6B

Referring now to FIG. 6A, in an alternative embodiment, a separate program counter 190 is provided for DSP operations. The core controller or processor (not shown) loads information into the program counter 190 for the DSP operation and then that program counter in turn addresses the memory block 150 to start the process for the DSP. Information required by the DSP operations would be stored in memory. Alternatively, any register of the core processor, such as data address register 142A or instruction address register 142B, can be used for addressing memory 150. Bit Configuration Table 140, in addition to generating memory configuration signal 152, produces address enable signal 156 to control address bus control circuitry 144 in order to select the address register which accesses memory block A and also to selectively enable or disable address lines of the registers to match the memory configuration (i.e. depending on the position of virtual boundary 136, address bits are enabled if the bit is needed to access all of memory block A and disabled if block A is smaller than the memory space accessed with the address bit).

Thus, FIG. 6A shows the DSP program counter 190 being loaded by the processor with an address to move into memory block A. In that case, the other address sources in register file 142 are disabled, at least with respect to addressing memory 150. In short, three different alternative mechanisms are illustrated for accessing the memory 150 in order to fetch the bit configurations and other parameters 140. The selection of which addressing mechanism is most advantageous may depend upon the particular processor architecture with which the present invention is implemented.

FIG. 6B shows an embodiment wherein MDSPC 172 is used to generate addresses for memory block A in place of DSP PC 190. Address enable signal 156 selects between the address lines of MDSPC 172 and those of register file 142 in response to the microcode executed by MDSPC 172. As discussed above, if the microcode for MDSPC 172 resides in memory block A or a portion thereof, MDSPC 172 will be executing out of memory block A and therefore requires access to the content of memory block A.

Memory Arrangement

Referring again to FIG. 5, memory blocks A (150) and B (160) are separated by "virtual boundary" 136. In other words, block A and block B are portions of a single, common memory, in a preferred embodiment. The location of the "virtual boundary" is defined by the configuration control signal generated responsive to the bit configuration table parameters. In this regard, the memory is reconfigurable under software control. Although this memory has a variable boundary, the memory preferably is part of the processor memory, it is not contemplated as a separate memory distinct from the processor architecture. In other words, in the processor application illustrated by FIGS. 5 and 6, the memory as shown and described is essentially reconfigurable directly into the microprocessor itself. In such a preferred embodiment, the memory block B, 160, duly configured, executes into the DSP execution unit as shown in FIG. 5.

In regard to FIG. 5B, virtual boundary 136 is controlled based on the microcode downloaded to MDSPC 172. Similarly, in FIG. 5C, microcode determines the position of both virtual boundary 136A and 136B to create memory block C 190.

Figure 7A:
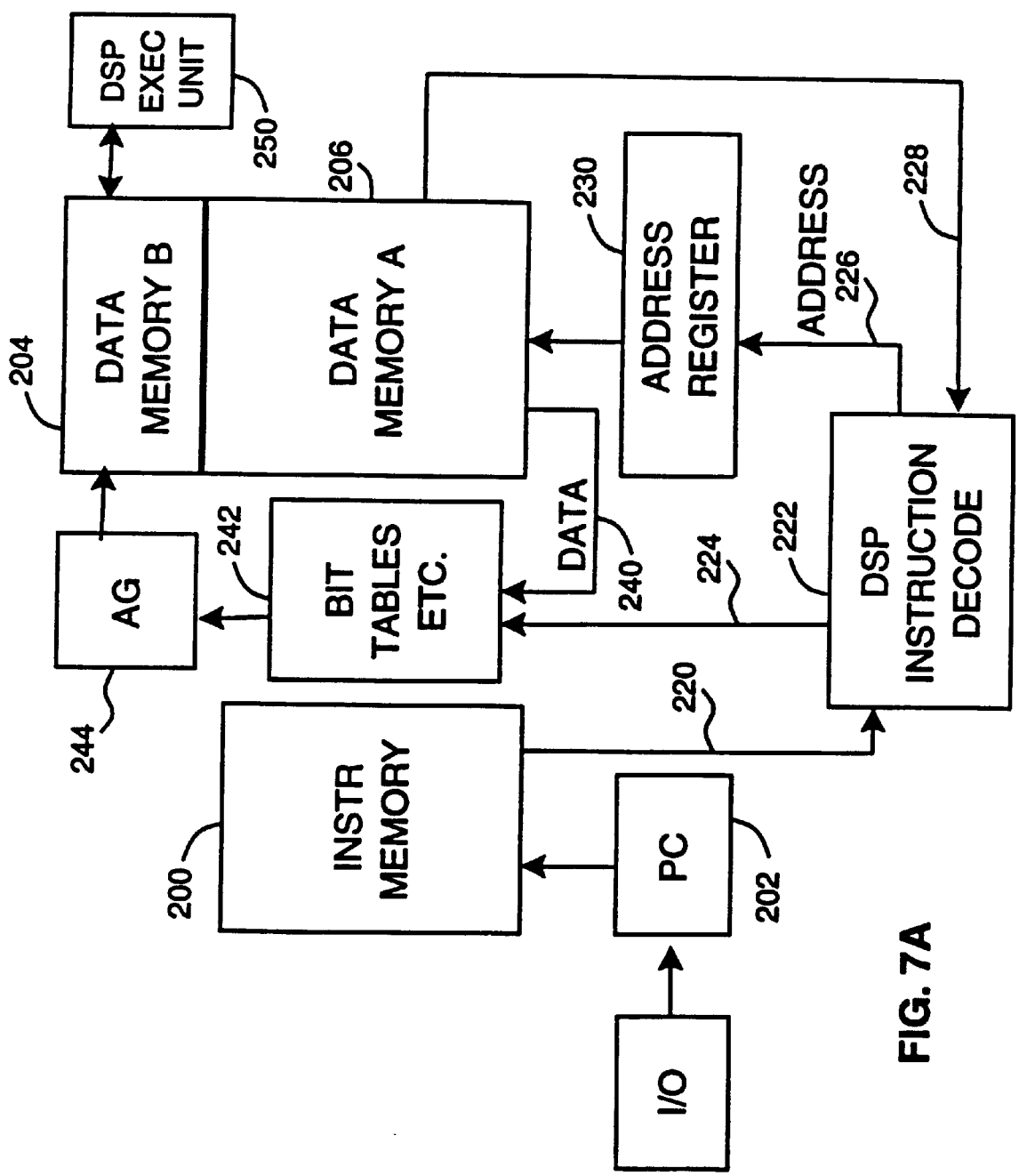
FIGS. 7A–B are block diagrams that illustrate embodiments of the invention in a Harvard architecture.
Figure 7B:
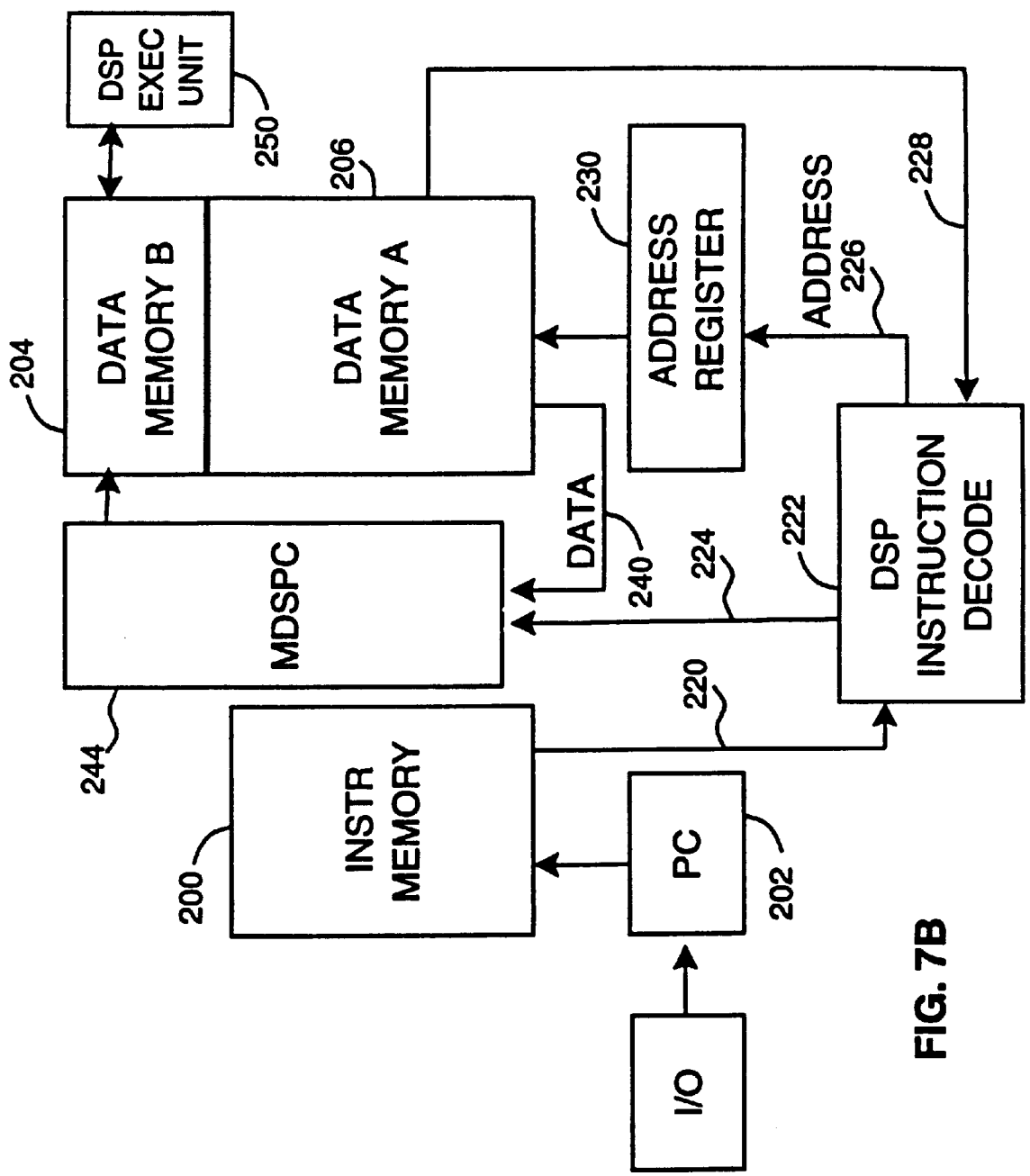

FIGS. 7A and 7B

FIG. 7A illustrates an alternative embodiment, corresponding to FIG. 5A, of the present invention in a Harvard-type architecture, comprising a data memory block A 206 and block B 204, and a separate core processor instruction memory 200. The instruction memory 200 in addressed by a program counter 202. Instructions fetched from the instruction memory 200 pass via path 220 to a DSP instruction decoder 222. The instruction decoder in turn provides addresses for DSP operations, table configurations, etc., to an address register 230. Address register 230 in turn addresses the data memory block A 206. Data from the memory passes via path 240 to load the bit configuration tables etc. 242 which in turn configure the address generator for addressing the data memory block B during the next execution cycle of the DSP execution unit 250. FIG. 6 thus illustrates an alternative approach to accessing the data memory A to fetch bit configuration data. A special instruction is fetched from the instruction memory that includes an opcode field that indicates a DSP operation, or more specifically, a DSP configuration operation, and includes address information for fetching the appropriate configuration for the subroutine.

In the embodiment of FIG. 7B, corresponding to the embodiments in FIGS. 5B and 5C, MDPSC 246 replaces AG 244 and Bit Configuration Table 242. Instructions in core processor instruction memory 200 that correspond to functions to be executed by DSP Execution Unit 250 are replaced with a preselected bit pattern which is not recognized as a valid instruction by the core processor. DSP Instruction Decode 222 decodes the preselected bit patterns and generates an address for DSP operations and address parameters stored in data memory A and also generates a DSP control signal which triggers the DSP process in MDSPC 246. DSP Instruction Decode 222 can also be structured to be responsive to output data from data memory A 206 into producing the addresses latched in address register 230.

The DSP Instruction Decode 222 may be reduced or eliminated if the DSP process is initiated by an instruction causing a jump to the bit table or microcode in memory block A pertaining to the execution of the DSP process.

To summarize, the present invention includes an architecture that features shared, reconfigurable memory for efficient operation of one or more processors together with one or more functional execution units such as DSP execution units. FIG. 6A shows an implementation of a sequence of operations, much like a subroutine, in which a core controller or processor loads address information into a DSP program counter, in order to fetch parameter information from the memory. FIG. 6B shows an implementation wherein the DSP function is executed under the control of an MDSPC under microcode control. In FIGS. 5A–C, the invention is illustrated as integrated with a von Neumann microprocessor architecture. FIGS. 7A and 7B illustrate applications of the present invention in the context of a Harvard-type architecture. The system of FIG. 1 illustrates an alternative stand-alone or coprocessor implementation. Next is a description of how to implement a shared, reconfigurable memory system.

Reconfigurable Memory Architecture

FIG. 8

Figure 8:
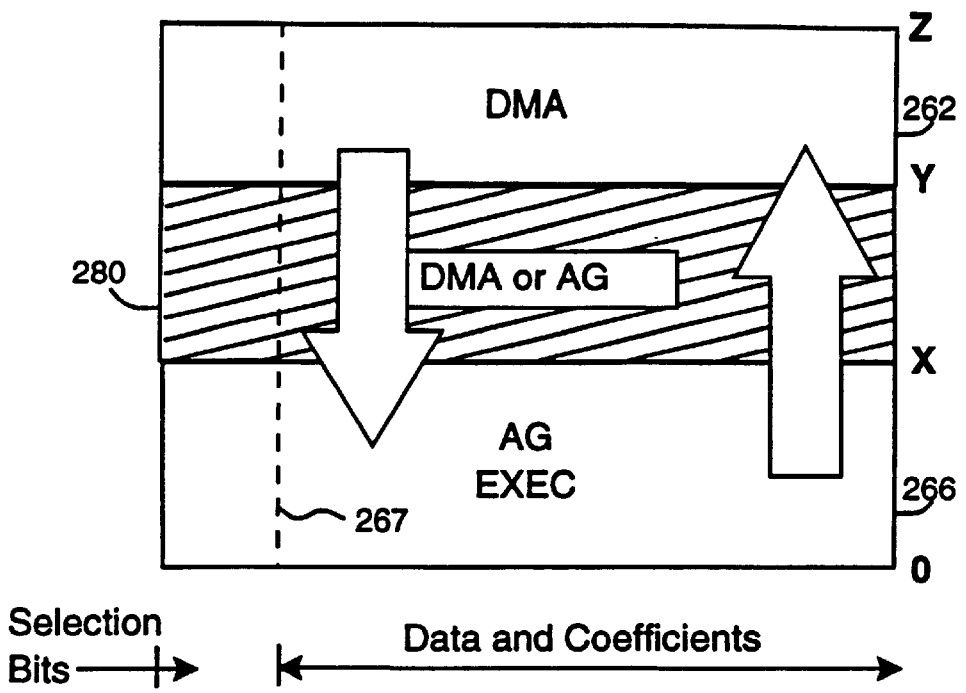
FIG. 8 is a conceptual diagram that illustrates a shared, reconfigurable memory architecture according to the present invention.

FIG. 8 is a conceptual diagram illustrating a reconfigurable memory architecture for DSP according to another aspect of the present invention. In FIG. 8, a memory or a block of memory includes rows from 0 through Z. A first portion of the memory 266, addresses 0 to X is associated, for example, with an execution unit (not shown). A second (hatched) portion of the memory 280 extends from addresses from X+1 to Y. Finally, a third portion of the memory 262, extending from addresses Y+1 to Z, is associated, for example, with a DMA or I/O channel. By the term "associated" here we mean a given memory segment can be accessed directly by the designated DMA or execution unit as futher explained herein. The second segment 280 is reconfigurable in that it can be switched so as to form a part of the execution segment 266 or become part of the DMA segment 262 as required.

The large vertical arrows in FIG. 8 indicate that the execution portion and the DMA portion of the memory space can be "swapped" as explained previously. The reconfigurable segment 280 swaps together with whichever segment it is coupled to at the time. In this block of memory, each memory word or row includes data and/or coefficients, as indicated on the right side of the figure.

Additional "configuration control bits" are shown to the left of dashed line 267. This extended portion of the memory can be used for storing a bit configuration table that provides configuration control bits as described previously with reference to the bit configuration table 140 of FIGS. 5A and 6A. These selection bits can include write enable, read enable, and other control information. So, for example, when the execution segment 266 is swapped to provide access by the DMA channel, configuration control bits in 266 can be used to couple the DMA channel to the I/O port of segment 266 for data transfer. In this way, a memory access or software trap can be used to reconfigure the system without delay.

The configuration control bits shown in FIG. 8 are one method of effecting memory reconfiguration that relates to the use of a separate address generator and bit configuration table as shown in FIGS. 5A and 7A. This approach effectively drives an address configuration state machine and requires considerable overhead processing to maintain the configuration control bits in a consistent and current state.

When the MDSPC of FIGS. 5B, 5C and 7B is used, the configuration control bits are unnecessary because the MDSPC modifies the configuration of memory algorithmically based upon the microcode executed by the MDSPC. Therefore, the MDSPC maintains the configuration of the memory internally rather than as part of the reconfigured memory words themselves.

FIG. 9

Figure 9:
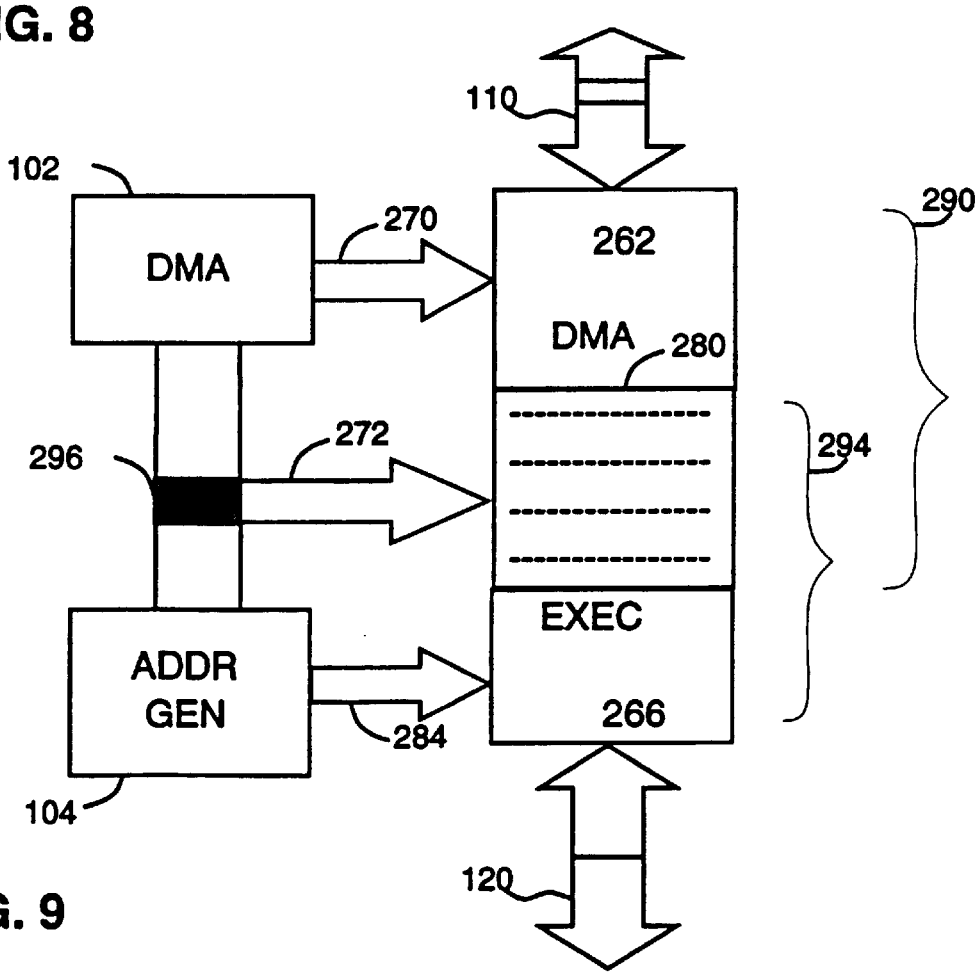
FIG. 9 illustrates connection of address lines to a shared, reconfigurable memory with selectable (granular) partitioning of the reconfigurable portion of the memory.

FIG. 9 illustrates connection of address and data lines to a memory of the type described in FIG. 8. Referring to FIG. 9, a DMA or I/O channel address port 102 provides sufficient address lines for accessing both the rows of the DMA block of memory 262, indicated as bus 270, as well as the reconfigurable portion of the memory 280, via additional address lines indicated as bus 272. When the block 280 is configured as a part of the DMA portion of the memory, the DMA memory effectively occupies the memory space indicated by the brace 290 and the address lines 272 are controlled by the DMA channel 102. FIG. 9 also shows an address generator 104 that addresses the execution block of memory 266 via bus 284. Address generator 104 also provides additional address lines for controlling the reconfigurable block 280 via bus 272. Thus, when the entire reconfigurable segment 280 is joined with the execution block 266, the execution block of memory has a total size indicated by brace 294, while the DMA portion is reduced to the size of block 262.

The address lines that control the reconfigurable portion of the memory are switched between the DMA address source 102 and address generator 104 via switching means 296. Illustrative switching means for addressing a single block of memory from multiple address generators was described above, for example with reference to FIG. 2. The particular arrangement depends in part on whether the memory is single-ported (see FIG. 2) or multi-ported (see FIGS. 3–4). Finally, FIG. 9 indicates data access ports 110 and 120. The upper data port 110 is associated with the DMA block of memory, which, as described, is of selectable size. Similarly, port 120 accesses the execution portion of the memory. Circuitry for selection of input (write) data sources and output (read) data destinations for a block of memory was described earlier. Alternative structures and implementation of multiple reconfigurable memory segments are described below.

It should be noted that the entire block need not be switched in toto to one memory block or the other. Rather, the reconfigurable block preferably is partitionable so that a selected portion (or all) of the block can be switched to join the upper or lower block. The granularity of this selection (indicated by the dashed lines in 280) is a matter of design choice, at a cost of additional hardware, e.g. sense amps, as the granularity increases, as further explained later.

FIG. 10

Figure 10:
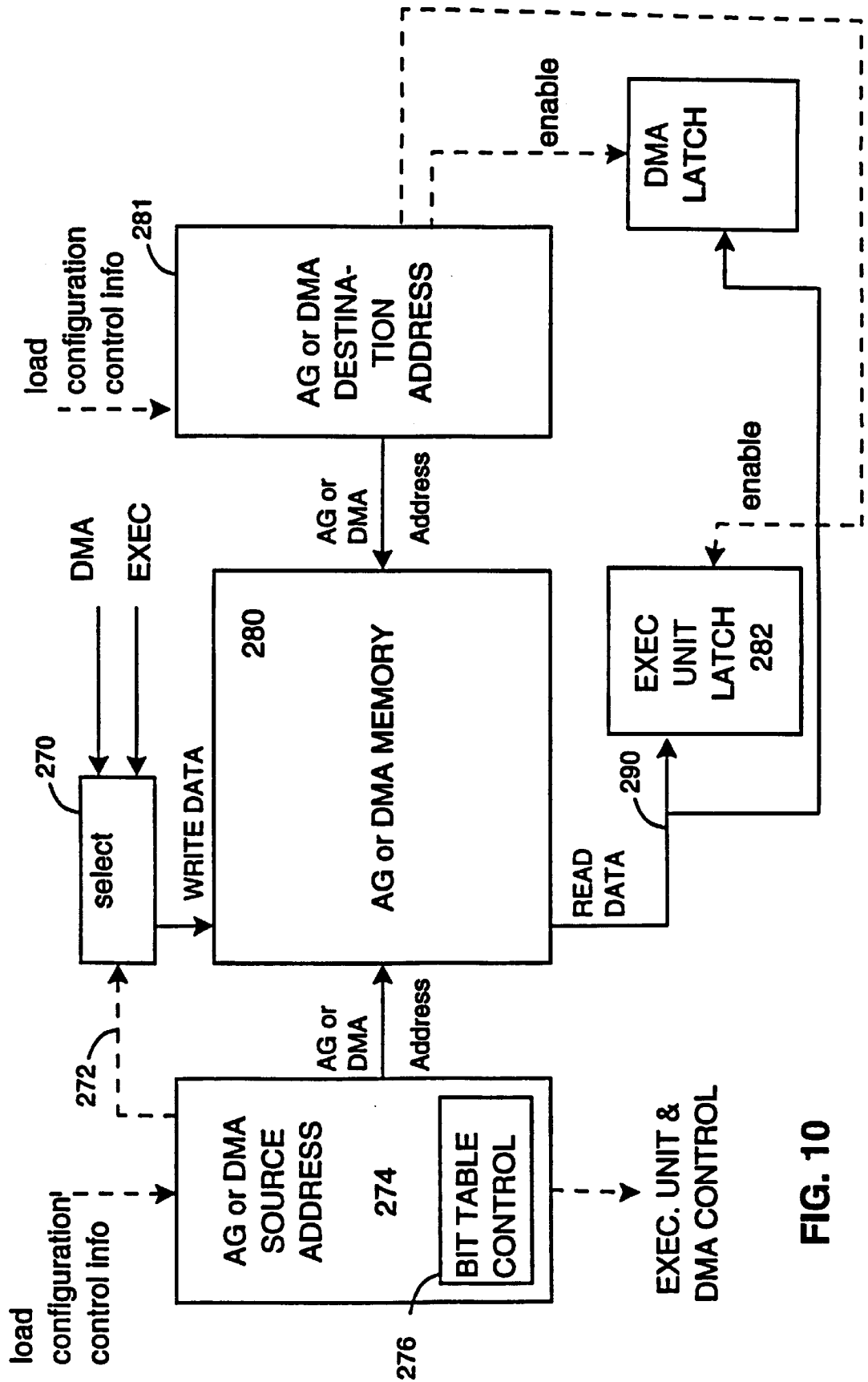
FIG. 10 illustrates a system that implements a reconfigurable segment of memory under bit selection table control.

FIG. 10 illustrates a system that implements a reconfigurable segment of memory 280 under bit selection table control. In FIG. 10, a reconfigurable memory segment 280 receives a source address from either the AG or DMA source address generator 274 and it receives a destination address from either the AG or DMA destination address generator 281. Write control logic 270, for example a word wide multiplexer, selects write input data from either the DMA channel or the execution unit according to a control signal 272. The source address generator 274 includes bit table control circuitry 276. The configuration control circuitry 276, either driven by a bit table or under microcode control, generates the write select signal 272. The configuration control circuitry also determines which source and destination addresses lines are coupled to the memory—either "AG" (address generator) when the block 280 is configured as part of the an "AG" memory block for access by the execution unit, or the "DMA" address lines when the block 280 is configured as part of the DMA or I/O channel memory block. Finally, the configuration control logic provides enable and/or clock controls to the execution unit 282 and to the DMA channel 284 for controlling which destination receives read data from the memory output data output port 290.

FIG. 11

Figure 11A:
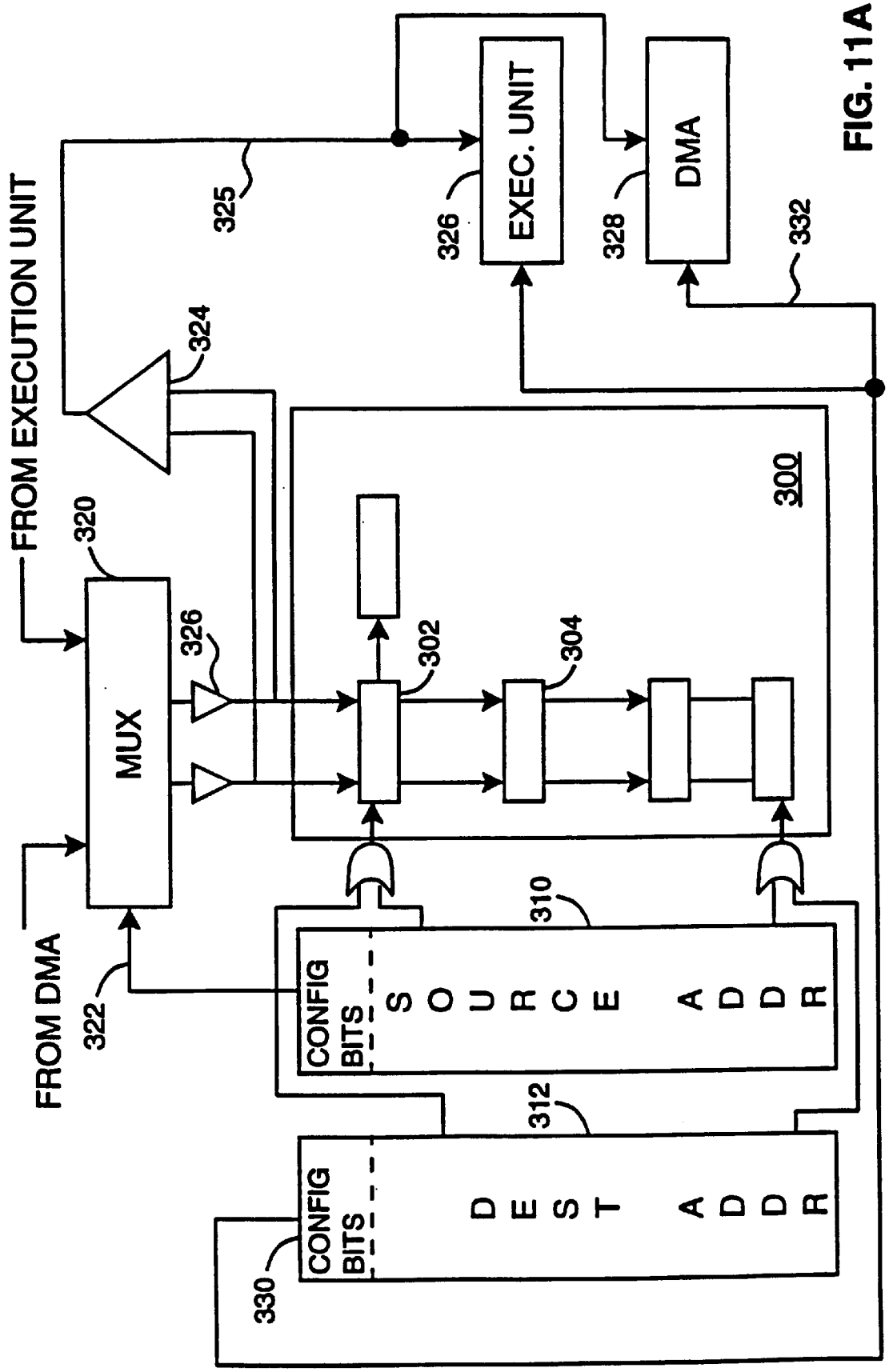
FIG. 11A is a block diagram illustrating an example of using single-ported RAM in a DSP computing system according to the present invention.
Figure 11B:
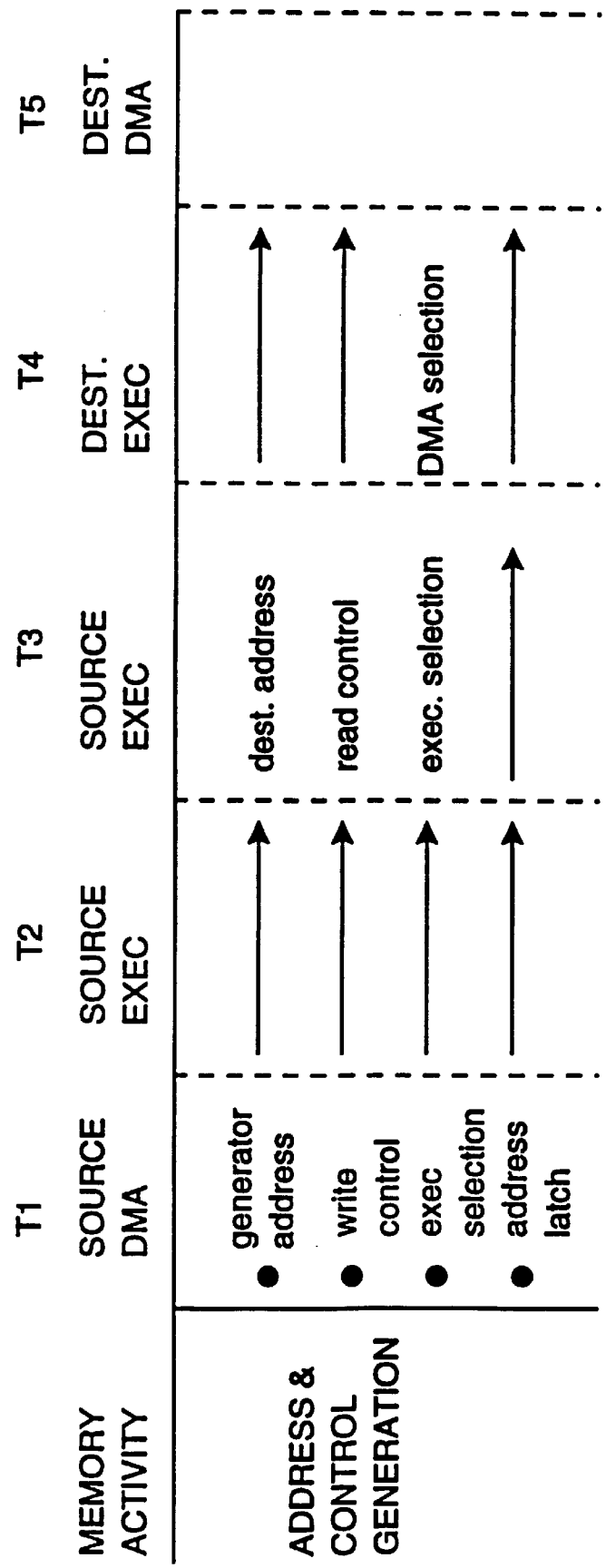
FIG. 11B is a table illustrating a pipelined timing sequence for addressing and accessing the one-port memory so as to implement a "virtual two-port" memory.

FIG. 11 is a partial block/partial schematic diagram illustrating the use of a single ported RAM in a DSP computing system according to the present invention. In FIG. 11, a single-ported RAM 300 includes a column of memory cells 302, 304, etc. Only a few cells of the array are shown for clarity. A source address generator 310 and destination address generator 312 are arranged for addressing the memory 300. More specifically, the address generators are arranged to assert a selected one address line at a time to a logic high state. The term "address generator" in this context is not limited to a conventional DSP address generator. It could be implemented in various ways, including a microprocessor core, microcontroller, programmable sequencer, etc. Address generation can be provided by a micro-coded machine. Other implementations that provide DSP type of addressing are deemed equivalents. However, known address generators do not provide control and configuration functions such as those illustrated in FIG. 10—configuration bits 330. For each row of the memory 300, the corresponding address lines from the source and destination blocks 310, 312, are logically "ORed" together, as illustrated by OR gate 316, with reference to the top row of the memory comprising memory cell 302. Only one row address line is asserted at a given time. For writing to the memory, a multiplexer 320 selects data either from the DMA or from the execution unit, according to a control signal 322 responsive to the configuration bits in the source address generator 310. The selected data is applied through drivers 326 to the corresponding column of the memory array 300 (only one column, i.e. one pair of bit lines, is shown in the drawing). For each column, the bit lines also are coupled to a sense amplifier 324, which in turn provides output or write data to the execution unit 326 and to the DMA 328 via path 325. The execution unit 326 is enabled by an execution enable control signal responsive to the configuration bits 330 in the destination address block 312. Configuration bits 330 also provide a DMA control enable signal at 332.

The key here is to eliminate the need for a two-ported RAM cell by using a logical OR of the last addresses from the destination and source registers (located in the corresponding destination or source address generators). Source and destination operations are not simultaneous, but operation is still fast. A source write cycle followed by a destination read cycle would take only a total time of two memory cycles.

FIG. 12

Figure 12:
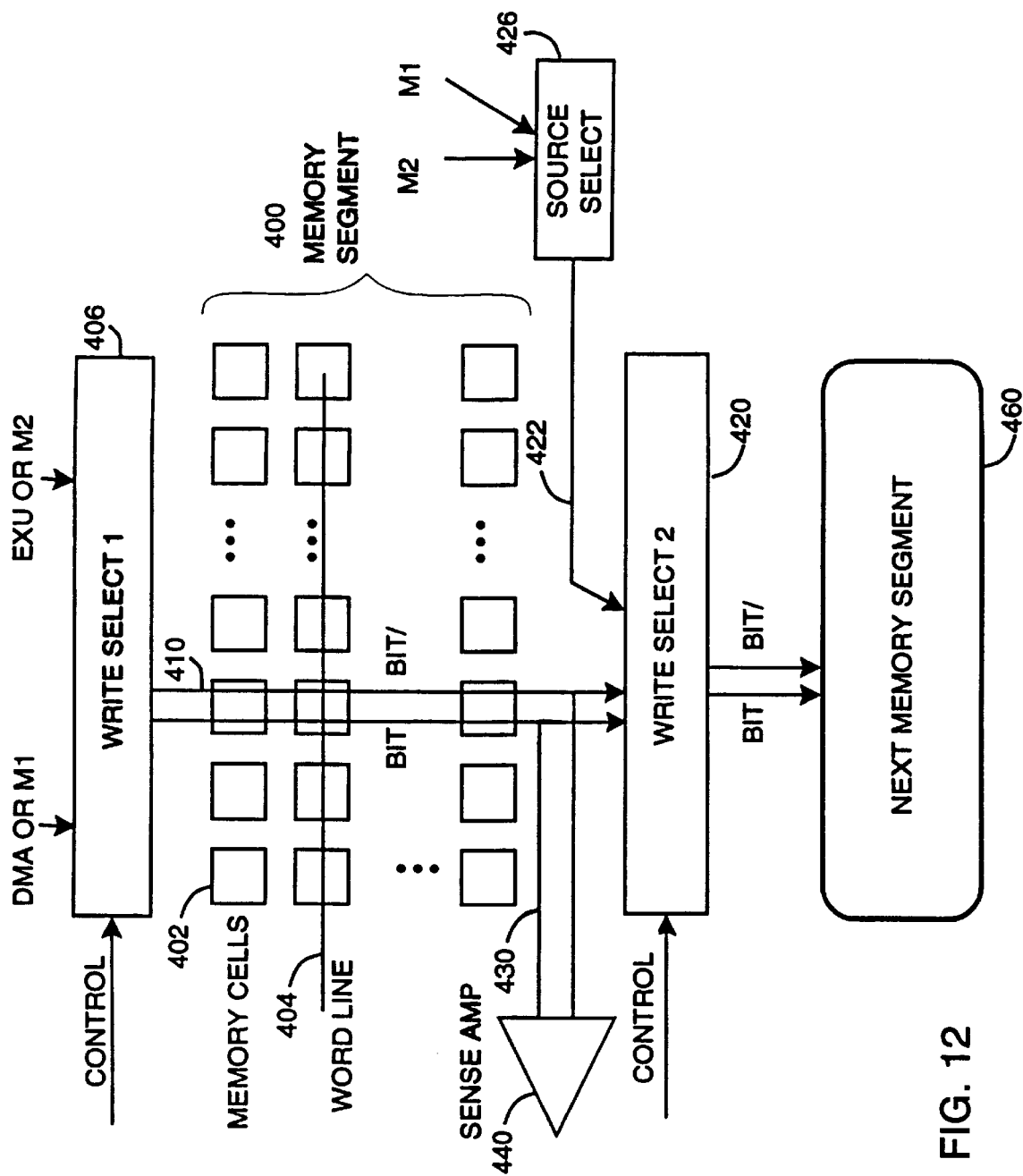
FIG. 12 illustrates a block of memory having at least one reconfigurable segment with selectable write and read data paths.

FIG. 12. The techniques and circuits described above for reconfigurable memory can be extended to multiple blocks of memory so as to form a highly flexible architecture for digital signal processing. FIG. 12 illustrates a first segment of memory 400 and a second memory segment 460. In the first segment 400, only a few rows and a few cells are shown for purposes of illustration. One row of the memory begins at cell 402, a second row of the memory begins at cell 404, etc. Only a single bit line pair, 410, is shown for illustration. At the top of the figure, a first write select circuit such as a multiplexer 406 is provided for selecting a source of write input data. For example, one input to the select circuit 406 may be coupled to a DMA channel or memory block M1. A second input to the MUX 406 may be coupled to an execution unit or another memory block M2. In this discussion, we use the designations M1, M2, etc., to refer generically, not only to other blocks of memory, but to execution units or other functional parts of a DSP system in general. The multiplexer 406 couples a selected input source to the bit lines in the memory segment 400. The select circuit couples all, say 64 or 128 bit lines, for example, into the memory. Preferably, the select circuit provides the same number of bits as the word size.

The bit lines, for example bit line pair 410, extend through the memory array segment to a second write select circuit 420. This circuit selects the input source to the second memory segment 460. If the select circuit 420 selects the bit lines from memory segment 400, the result is that memory segment 400 and the second memory segment 460 are effectively coupled together to form a single block of memory. Alternatively, the second select circuit 420 can select write data via path 422 from an alternative input source. A source select circuit 426, for example a similar multiplexer circuit, can be used to select this input from various other sources, indicated as M2 and M1. When the alternative input source is coupled to the second memory segment 460 via path 422, memory segment 460 is effectively isolated from the first memory segment 400. In this case, the bit lines of memory segment 400 are directed via path 430 to sense amps 440 for reading data out of the memory segment 400. When the bitlines of memory segment 400 are coupled to the second segment 460, sense amps 440 can be sent to a disable or low power standby state, since they need not be used.

FIG. 13

Figure 13:
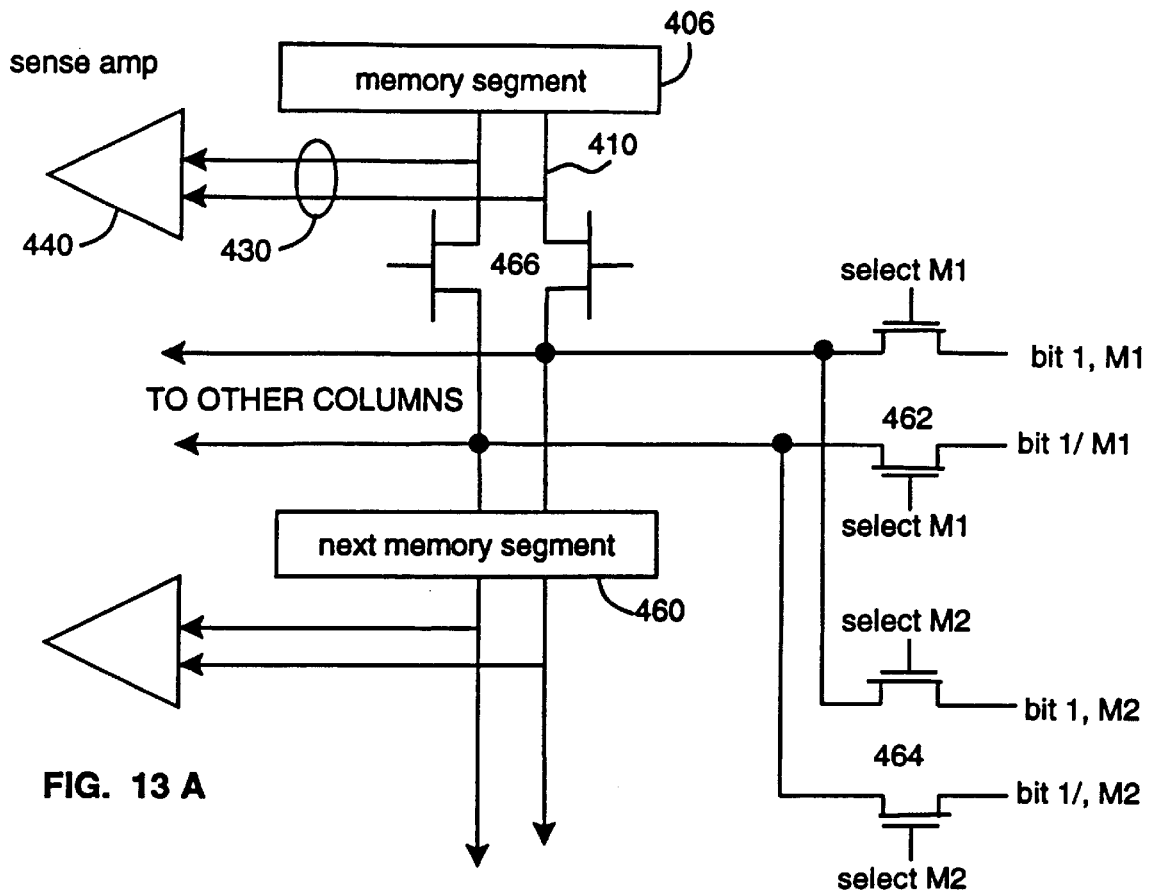
FIG. 13A is a schematic diagram showing detail of one example of the write selection circuitry of the reconfigurable memory of FIG. 12.
FIG. 13B illustrates transistor pairs arranged for propagating or isolating bit lines as an alternative to transistors 466 in FIG. 13A or as an alternative to the bit select transistors 462, 464 of FIG. 13A.
Figure 13:
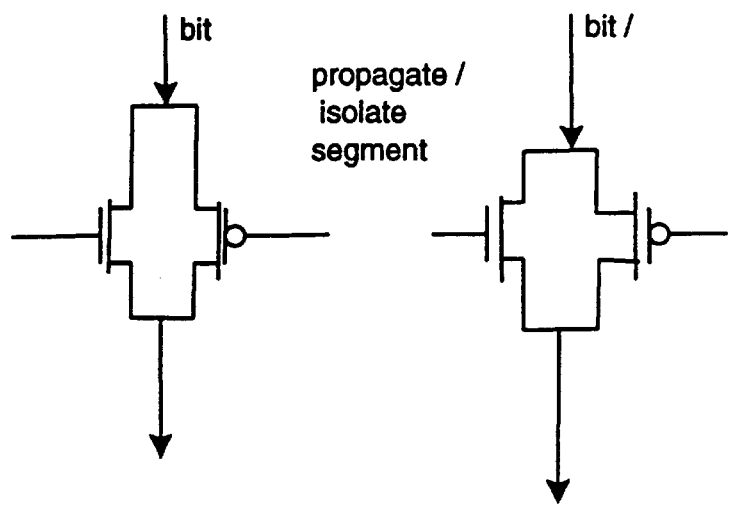

FIG. 13 shows detail of the input selection logic for interfacing multiple memory segments. In FIG. 13, the first memory segment bit line pair 410 is coupled to the next memory segment 460, or conversely isolated from it, under control of pass devices 466. When devices 466 are turned off, read data from the first memory segment 406 is nonetheless available via lines 430 to the sense amps 440. The input select logic 426 includes a first pair of pass transistors 426 for connecting bit lines from source M1 to bit line drivers 470. A second pair of pass transistors 464 controllably couples an alternative input source M2 bit lines to drivers 470. The pass devices 462, 464, and 466, are all controllable by control bits originating, for example, in the address generator circuitry described above with reference to FIG. 9. Pass transistors, transmission gates or the like can be considered equivalents for selecting input (write data) sources.

FIG. 14

Figure 14:
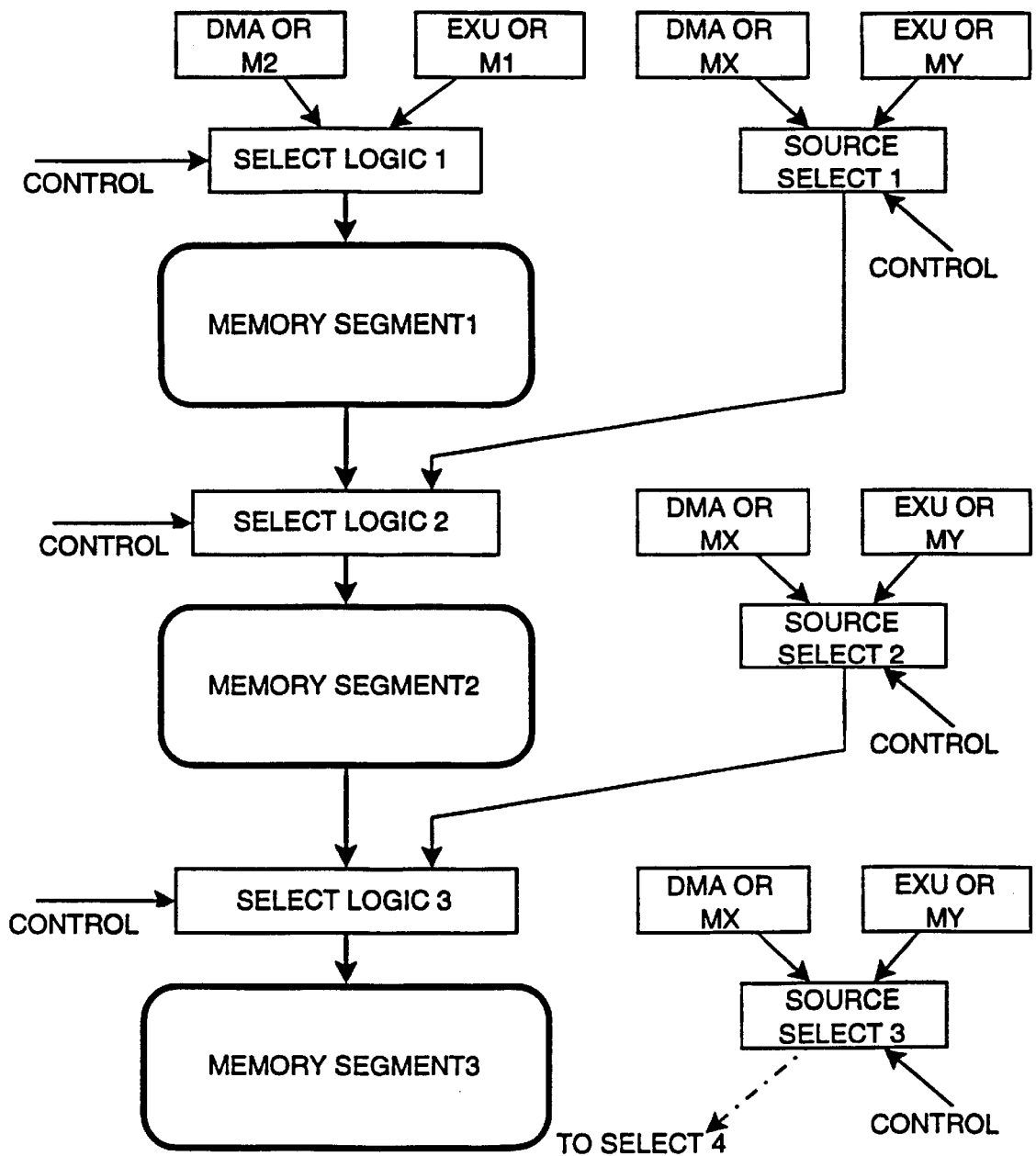
FIG. 14 is a block diagram illustrating extension of the shared, reconfigurable memory architecture to multiple segments of memory.

FIG. 14 is a high-level block diagram illustrating extension of the architectures of FIGS. 12 and 13 to a plurality of memory segments. Details of the selection logic and sense amps is omitted from this drawing for clarity. In general, this drawing illustrates how any available input source can be directed to any segment of the memory under control of the configuration bits.

Figure 15:
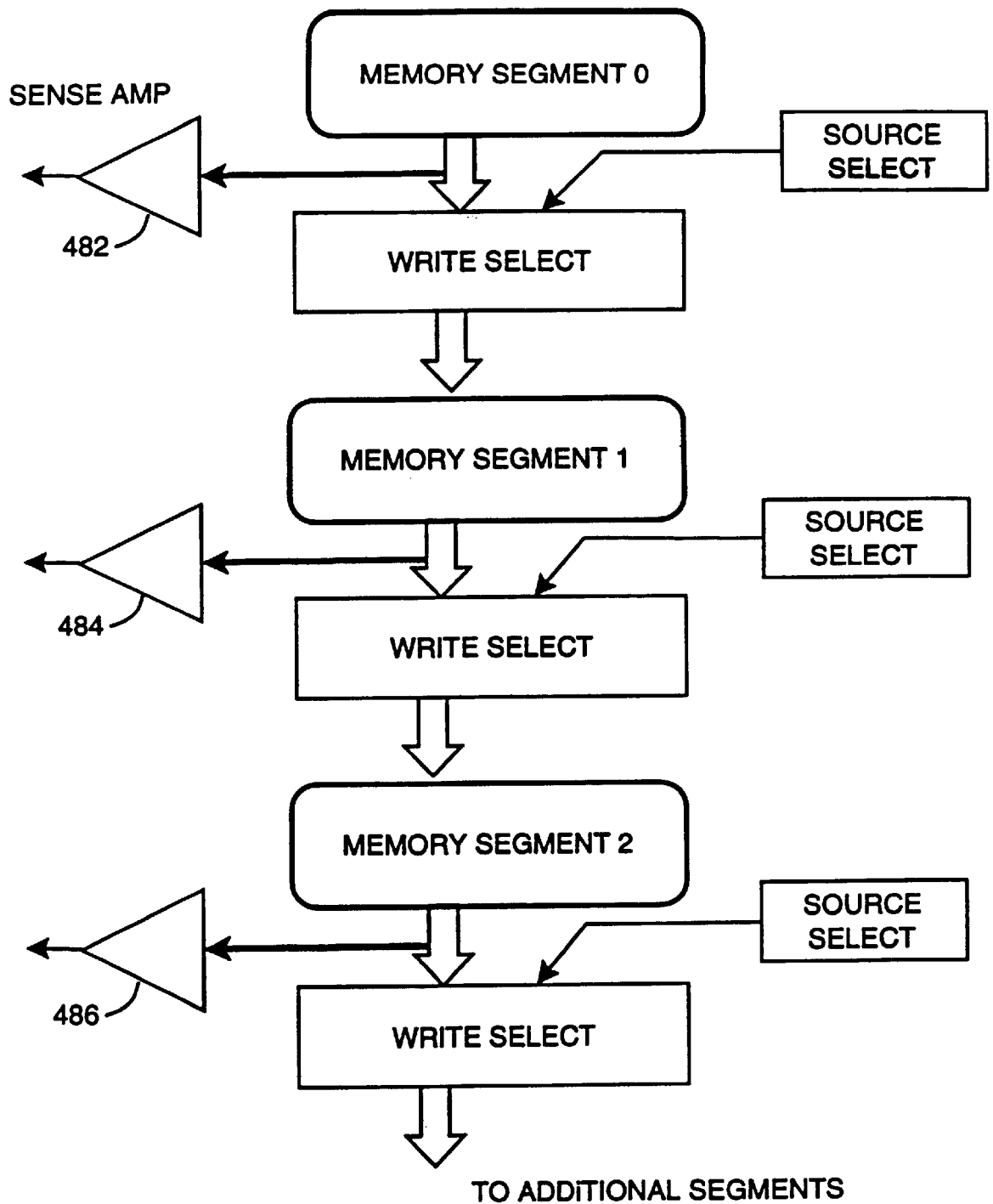
FIG. 15 is a simplified block diagram illustrating multiple reconfigurable memory segments with multiple sets of sense amps.

FIG. 15 is another block diagram illustrating a plurality of configurable memory segments with selectable input sources, as in FIG. 14. In this arrangement, multiple sense amps 482, 484, 486, are coupled to a common data output latch 480. When multiple memory segments are configured together so as to form a single block, fewer than all of the sense amps will be used. For example, if memory segment 0 and memory segment 1 are configured as a single block, sense amp 484 provides read bits from that combined block, and sense amp 482 can be idle.

Figure 16A:
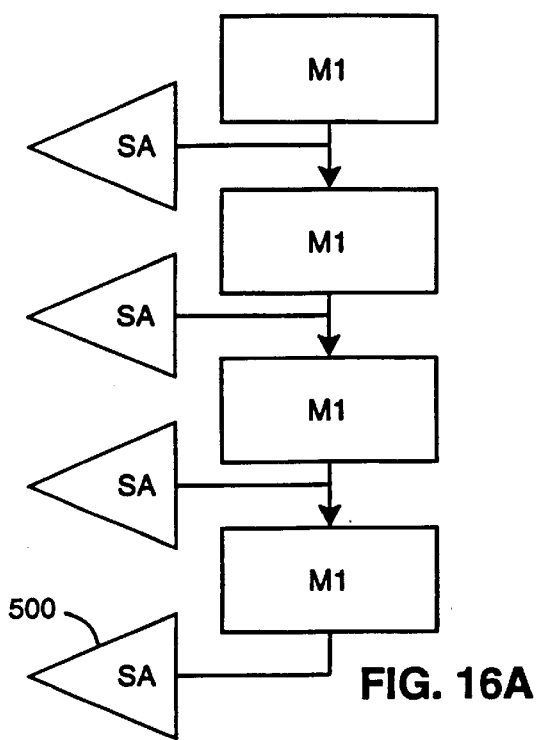
FIGS. 16A–16D are simplified block diagrams illustrating various examples of memory segment configurations to form memory blocks of selectable size.
Figure 16B:
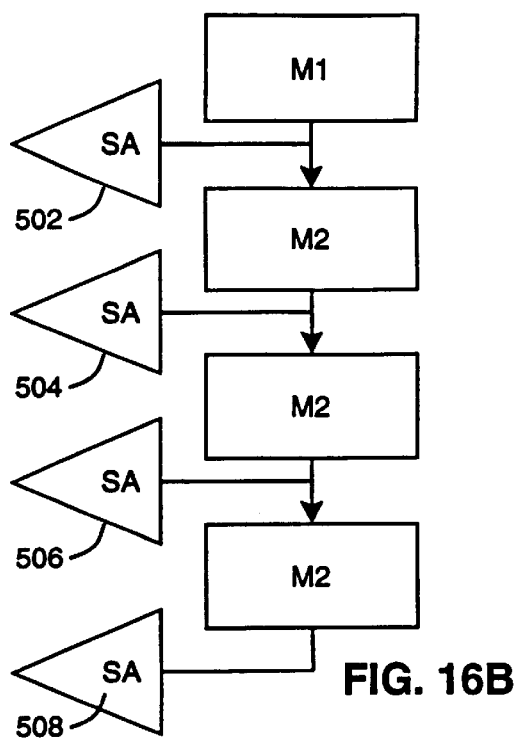
Figure 16C:
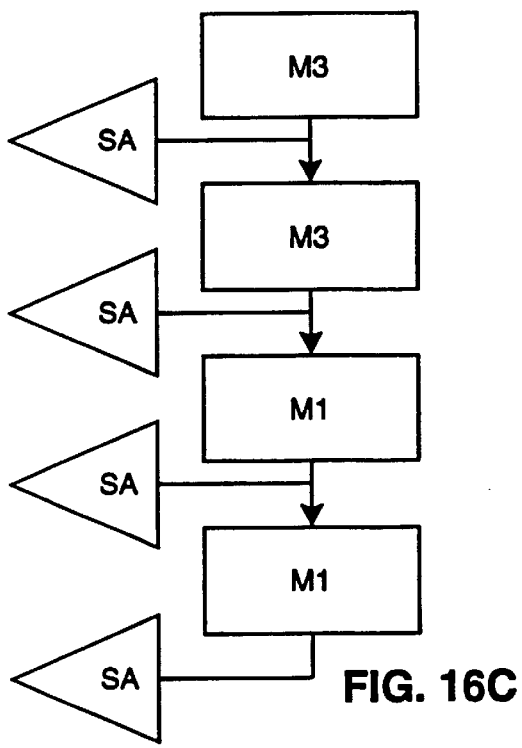
Figure 16D:
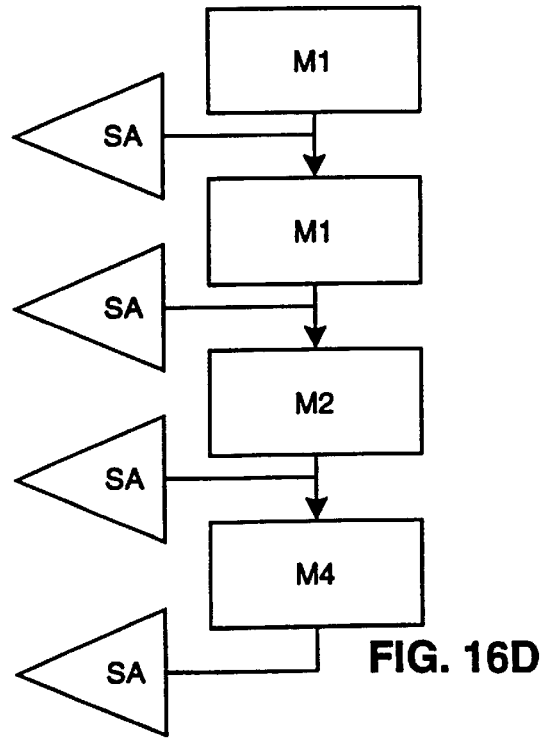

FIGS. 16A through 16D are block diagrams illustrating various configurations of multiple, reconfigurable blocks of memory. As before, the designations M1, M2, M3, etc., refer generically to other blocks of memory, execution units, I/O channels, etc. In FIG. 16A, four segments of memory are coupled together to form a single, large block associated with input source M1. In this case, a single sense amp 500 can be used to read data from this common block of memory (to a destination associated with M1). In FIG. 16B, the first block of memory is associated with resource M1, and its output is provided through sense amp 502. The other three blocks of memory, designated M2, are configured together to form a single block of memory—three segments long—associated with resource M2. In this configuration, sense amp 508 provides output from the common block (3×M2), while sense amps 504 and 506 can be idle. FIGS. 16C and 16D provide additional examples that are self explanatory in view of the foregoing description. This illustration is not intended to imply that all memory segments are of equal size. To the contrary, they can have various sizes as explained elsewhere herein.

Figure 17:
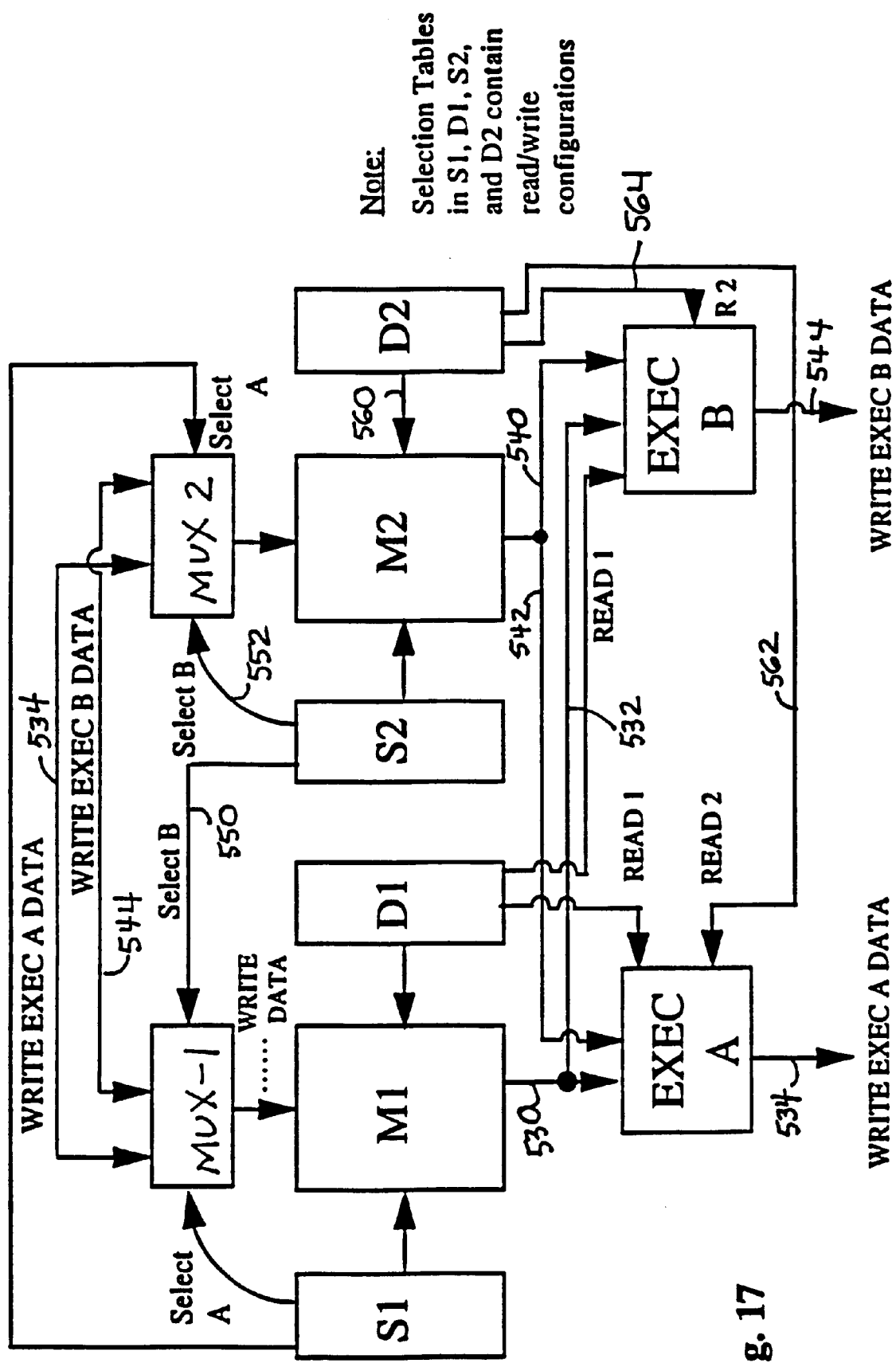
FIG. 17 is a block diagram of a DSP architecture illustrating a multiple memory block to multiple execution unit interface scheme in which configuration is controlled via specialized address generators.

FIG. 17 is a high-level block diagram illustrating a DSP system according to the present invention in which multiple memory blocks are interfaced to multiple execution units so as to optimize performance of the system by reconfiguring it as necessary to execute a given task. In FIG. 17, a first block of memory M1 provides read data via path 530 to a first execution unit ("EXEC A") and via path 532 to a second execution unit (EXEC B"). Execution unit A outputs results via path 534 which in turn is provided both to a first multiplexer or select circuit MUX-1 and to a second select circuit MUX-2. MUX-1 provides select write data into memory M1.

Similarly, a second segment of memory M2 provides read data via path 542 to execution unit A and via path 540 to execution unit B. Output data or results from execution unit B are provided via path 544 to both MUX-1 and to MUX-2. MUX-2 provides selected write data into the memory block M2. In this way, data can be read from either memory block into either execution unit, and results can be written from either execution unit into either memory block.

A first source address generator S1 provides source addressing to memory block M1. Source address generator S1 also includes a selection table for determining read/write configurations. Thus, S1 provides control bit "Select A" to MUX--1 in order to select execution unit A as the input source for a write operation to memory M1. S1 also provides a "Select A" control bit to MUX-2 in order to select execution unit A as the data source for writing into memory M2.

A destination address generator D1 provides destination addressing to memory block M1. D1 also includes selection tables which provide a "Read 1" control signal to execution A and a second "Read 1" control signal to execution unit B. By asserting a selected one of these control signals, the selection bits in D1 directs a selected one of the execution units to read data from memory M1.

A second source address generator S2 provides source addressing to memory segment M2. Address generator S2 also provides a control bit "select B" to MUX-1 via path 550 and to MUX-2 via path 552. These signals cause the corresponding multiplexer to select execution unit B as the input source for write back data into the corresponding memory block. A second destination address generator D2 provides destination addressing to memory block M2 via path 560. Address generator D2 also provides control bits for configuring this system. D2 provides a read to signal to execution unit A via path 562 and a read to signal to execution unit B via path 564 for selectively causing the corresponding execution unit to read data from memory block M2.

Figure 18A:
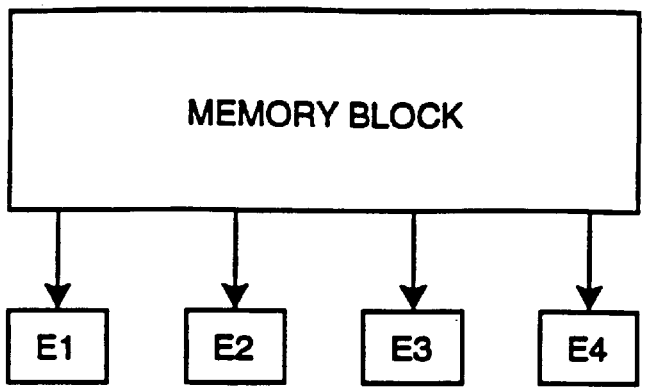
FIGS. 18A–18C are simplified block diagrams illustrating various configurations of segments of a memory block into association with multiple execution units.
Figure 18B:
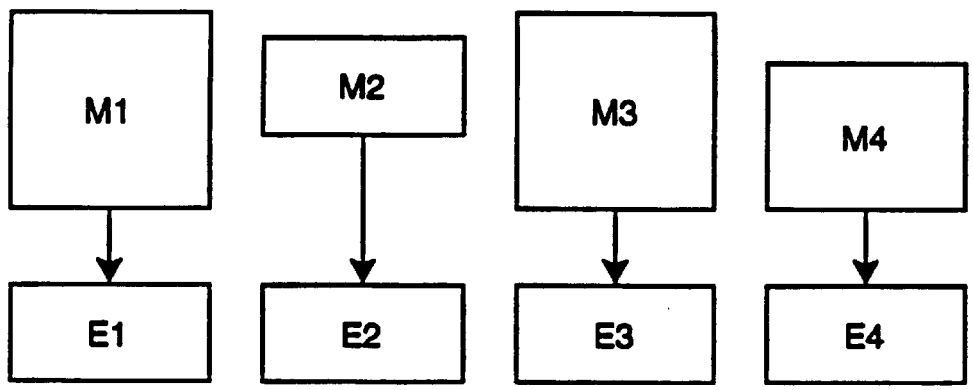
Figure 18C:
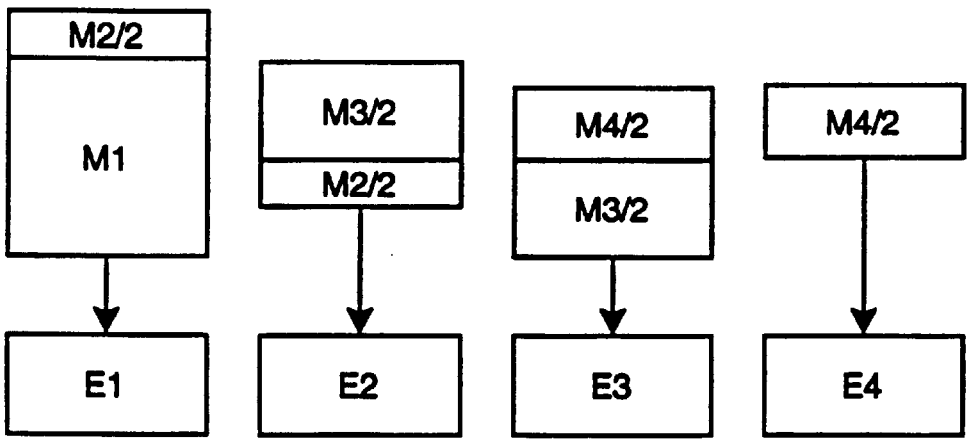

FIG. 18A illustrates at a high level the parallelism of memory and execution units that becomes available utilizing the reconfigurable architecture described herein. In FIG. 18A, a memory block, comprising for example 1,000 rows, may have, say, 256 bits and therefore 256 outputs from respective sense amplifiers, although the word size is not critical. 64 bits may be input to each of four parallel execution units E1–E4. The memory block thus is configured into four segments, each segment associated with a respective one of the execution units, as illustrated in FIG. 18B. As suggested in the figure, these memory segments need not be of equal size. FIG. 18C shows a further segmentation, and reconfiguration, so that a portion of segment M2 is joined with segment M1 so as to form a block of memory associated with execution unit E1. A portion of memory segment M3, designated "M3/2" is joined together with the remainder of segment M2, designated "M2/2", to form a memory block associated with execution unit E2, and so on.

Figure 19:
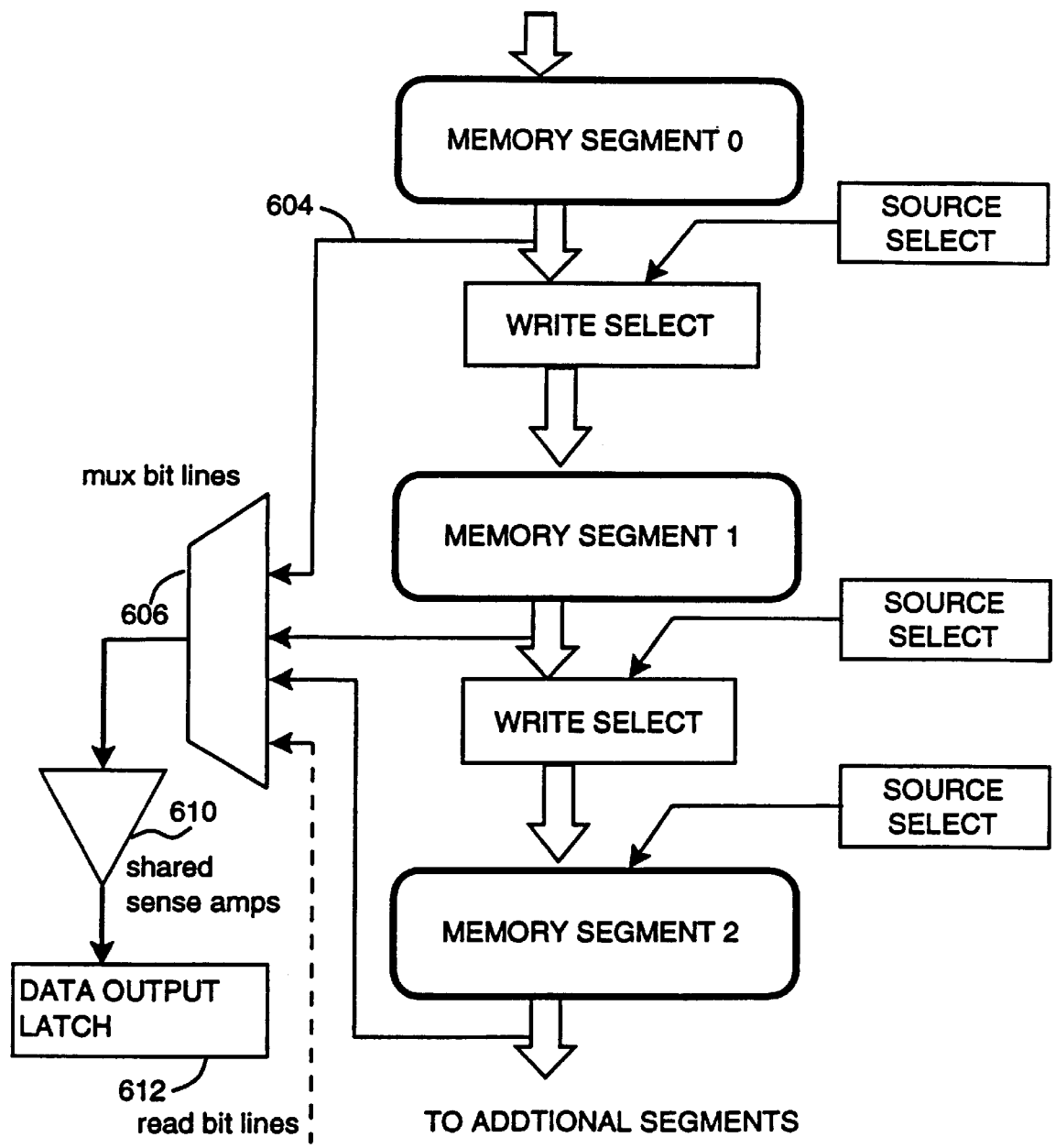
FIG. 19 is a simplified block diagram illustrating a shared, reconfigurable memory system utilizing common sense amps.

Note, however, that the choice of one half block increments for the illustration above is arbitrary. Segmentation of the memory may be designed to permit reconfigurability down to the granularity of words or bits if necessary. FIG. 19.

The use of multiple sense amps for memory segment configuration was described previously with reference to FIGS. 15 and 16. FIG. 19 illustrates an alternative embodiment in which the read bit lines from multiple memory segments, for example read bit lines 604, are directed to a multiplexer circuit 606, or its equivalent, which in turn has an output coupled to shared or common set of sense amps 610. Sense amps 610 in turn provide output to a data output latch 612, I/O bus or the like. The multiplexer or selection circuitry 604 is responsive to control signals (not shown) which select which memory segment output is "tapped" to the sense amps. This architecture reduces the number of sense amps in exchange for the addition of selection circuitry 606.

Figure 20:
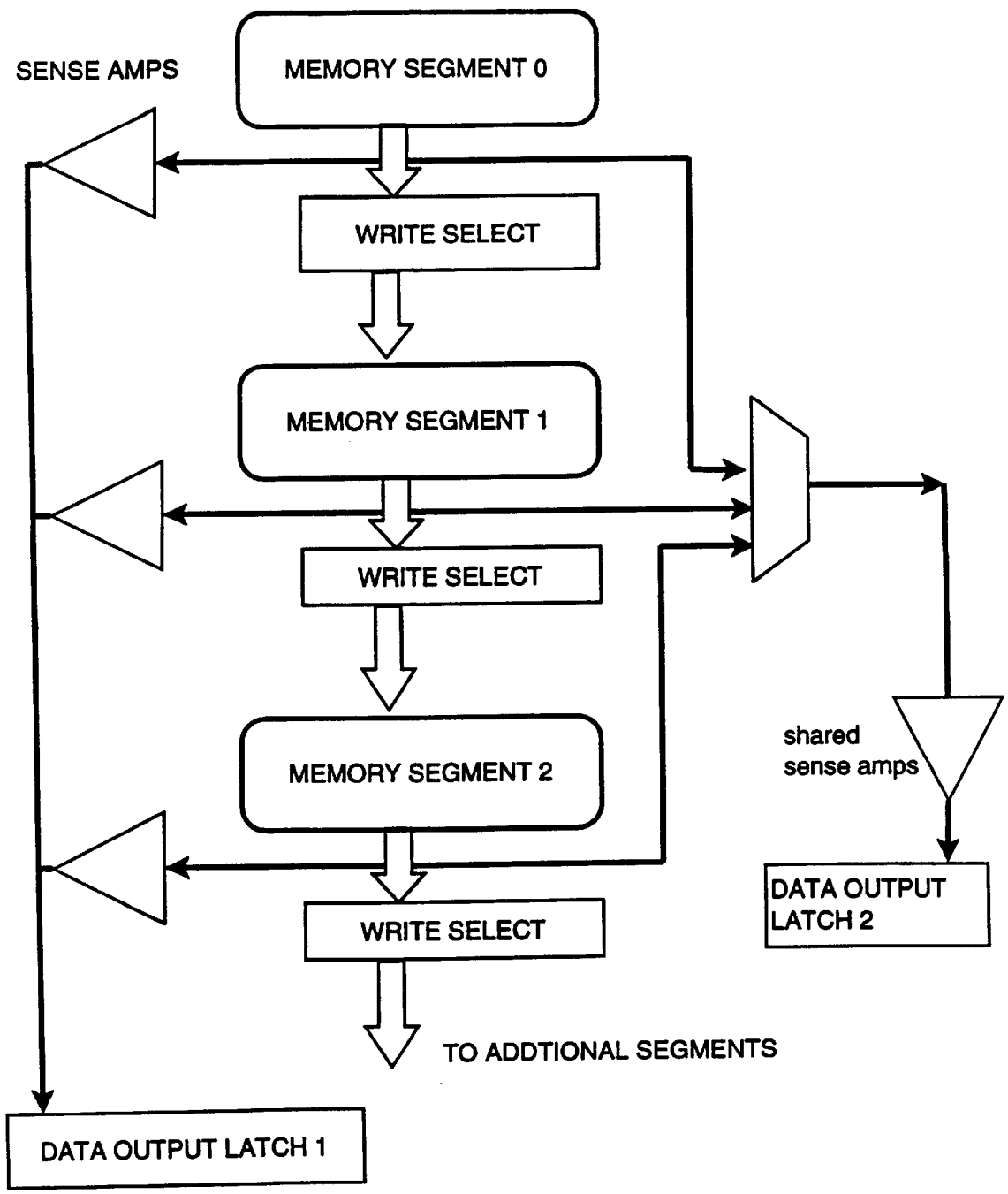
FIG. 20 is a simplified block diagram illustrating a shared, reconfigurable memory system utilizing multiple sense amps for each memory segment.

FIG. 20. is a block diagram illustrating a memory system of multiple configurable memory segments having multiple sense amps for each segment. This alternative can be used to improve speed of "swapping" read data paths and reduce interconnect overhead in some applications.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. A memory system for use in digital signal processing comprising:

an array of memory cells;

the array of memory cells including a plurality of word lines, each word line arranged for accessing a corresponding row of the memory cells;

the array of memory cells further including a plurality of bit lines, each of the bit lines coupled to a corresponding one of the memory cells in each row of the memory cells;

switching circuitry for controllably dividing each one of the plurality of bit lines of the array to form first and second blocks of memory cells;

a first address generator for indicating a first selected one at a time of the word lines in the first and second memory blocks;

a second address generator for indicating a second selected one at a time of the word lines in the first and second memory blocks;

address switching means for coupling the first address generator to the word lines of the first memory block and the second address generator to the word lines of the second memory block responsive to a first value of a configuration control signal, and coupling the first address generator to the word lines of the second memory block and the second address generator to the word lines of the first memory block responsive to a second value of the configuration control signal; and a data multiplexer means for coupling the bit lines of the first memory block to a first data port and the bit lines of the second memory block to a second data port responsive to a first value of a selection control signal and coupling the bit lines of the first memory block to the second data port and the bit lines of the second memory block to the first data port responsive to a second value of the selection control signal.

2. A memory system according to claim 1 wherein:

the first and second address generators each includes means for latching a current address and further comprising a logic-OR gate for each of the word lines, the logic-OR gates being arranged so as to assert a corresponding one of the word lines in response to the said word line being asserted by either one of the first and second address generator latching means.

3. A memory system according to claim 1 wherein the address switching means and data multiplexer means for coupling the bit lines each comprise a multiplexer circuit responsive to the configuration control signal.

4. A memory system according to claim 1 wherein each of the address switching means and data multiplexer means comprise a plurality of pass transistors each having a respective gate terminal responsive to the configuration control signal.

5. A memory system according to claim 1 wherein the memory cells in the array are single-port RAM cells.

6. A memory system according to claim 1 further comprising:
   a configuration table; and
   means for providing the configuration control signal to the address switching means and the data multiplexer means in response to one or more control bits stored in the configuration table.

7. A memory system according to claim 6 wherein the configuration table is stored in a memory.

8. A memory system according to claim 7 wherein the configuration table is stored in the array.

9. A memory system for use in digital signal processing comprising:
   an array of memory cells;
   the array of memory cells including a plurality of word lines, each word line arranged for accessing a corresponding row of the array;
   the array of memory cells further including a plurality of bit lines, each of the bit lines coupled to a corresponding one of the memory cells in each row of the array;
   switching circuitry for dividing each one of the plurality of bit lines of the array to form first and second blocks of memory cells;
   a first address generator for indicating a selected one at a time of the word lines in the first and second memory blocks;
   a second address generator for indicating a selected one at a time of the word lines in the first and second memory blocks; and
   means for coupling a first selected one at a time of the first and second address generators to the first memory block of the array so as to assert the word line in the first memory block indicated by the first selected address generator and a second selected one at a time of the first and second address generators to the second memory block of the array so as to assert the word line in the second memory block indicated by the second selected address generator, the coupling means being arranged to select said first and second selected ones of the first and second address generators in response to an address select control signal;
   first input means for receiving one or more bits of write data from a first data source;
   second input means for receiving one or more bits of write data from a second data source; and
   data multiplexer means for coupling a first selected one at a time of the first and second input means to the bit lines of the first memory block for writing data into the first memory block from the corresponding data source and coupling a second selected one at a time of the first and second input means to the bit lines of the second memory block for writing data into the second memory block from the corresponding data source, the input control means being arranged to select said first and second data ones of the first and second input means in response to a data source select control signal.

10. A memory system according to claim 9 where the data multiplexer means comprises a multiplexer circuit, the multiplexer circuit being controllable in response to the data source select control signal.

11. A memory system according to claim 9 further comprising a configuration table and means for providing source select control signal to the data multiplexer means in response to one or more control bits stored in the configuration table.

12. A memory system according to claim 11 and further comprising means for providing the address select control signal to the coupling means in response to one or more control bits stored in the configuration table.

13. A memory system according to claim 11 further comprising input select control bits stored in the configuration table for enabling a selected output path from the array for a read operation.

14. The memory system according to claim 6, where the configuration table includes a boundary control word for controlling the switching circuitry, and wherein the switching circuitry, responsive to the boundary control word, dynamically configures a boundary between the first and second memory blocks.

15. The memory system according to claim 14, wherein the switching circuitry further comprises a plurality of sense amps disposed at predetermined positions along each of the bit lines of the memory array, where each of the sense amps is configured to be responsive to the boundary control word to dynamically configure the boundary between the first and second memory blocks.

16. A memory system according to claim 11, wherein the configuration table includes a boundary control word for controlling the switching circuitry, and wherein the switching circuitry, responsive to the boundary control word, dynamically configures a boundary between the first and second memory blocks.

17. A memory system according to claim 16, wherein the switching circuitry further comprises a plurality of sense amps disposed at predetermined positions along each of the bit lines of the memory array, where each of the sense amps is configured to be responsive to the boundary control word to dynamically configure the boundary between the first and second memory blocks.

18. A method for continuous execution of multiple processes in a single memory array, the method comprising the steps of:
   providing a contiguous series of segments of memory cells forming the memory array;
   configuring a first contiguous set of the segments to form a first block of memory;
   configuring a second contiguous set of the segments non-overlapping the first set, to form a second block of memory;
   executing a first process in the first block of memory;
   executing a second process in the second block of memory;
   swapping the first and second blocks of memory;
   continuing execution of the second process in the first block of memory; and
   continuing execution of the first process in the second block of memory;

repeating said swapping and both continuing steps so that the first and second processes operate substantially continuously.

19. A method according to claim 18 wherein said configuring the first set of segments includes:

selecting a first input source for writing data into the first block of memory;

selecting a first output destination for reading data out of the first block of memory; and selecting a first address generator for addressing the first block of memory.

20. A method according to claim 19 wherein said configuring the second set of segments includes:

selecting a second input source for writing data into the second block of memory;

selecting a second output destination for reading data out of the second block of memory; and selecting a second address generator for addressing the second block of memory.

21. A method according to claim 20 wherein said swapping the memory blocks includes:

selected the first input source for writing data into the second block of memory;

selecting the first output destination for reading data out of the second block of memory;

selecting the first address generator for addressing the second block of memory;

selecting the second input source for writing data into the first block of memory;

selecting the second output destination for reading data out of the first block of memory; and selecting the second address generator for addressing the first block of memory.

22. A method according to claim 20 wherein said providing the segments of memory cells includes, for each segment, providing a corresponding write selection circuit and providing a corresponding output circuit, so as to provide individual access to each segment of memory cells.

23. A method according to claim 22 wherein the first block of memory comprises only one segment and said configuring the first set of memory segments includes:

selecting the write selection circuit corresponding to said one segment for writing data into the first block; and selecting the output circuit corresponding to said one segment for reading data from the first block.

24. A method according to claim 22 wherein the first block comprises first and second segments and said configuring the first set of memory segments includes:

selecting the write selection circuit corresponding to the first segment for writing data into the first block; and selecting the output circuit corresponding to the second segment for reading data from the first block; and selecting bit lines of the first segment as the input to the write selection circuit of the second segment.

25. A method according to claim 22 wherein:

the first block comprises a first segment, a last segment and at least one intermediate segment between the first and second segments, and said configuring the first set of memory segments includes:

selecting the write selection circuit corresponding to the first segment for writing data into the first block;

for each intermediate segment, selecting bit lines of an immediately preceding segment as the input to the write selection circuit of said intermediate segment;

for the last segment, selecting bit lines of the immediately preceding intermediate segment as the input to the write selection circuit of the last segment;

selecting the output circuit corresponding to the last segment for reading data from the first block.

\* \* \* \* \*

UNITED STATES PATENT AND TRADEMARK OFFICE
CERTIFICATE OF CORRECTION

PATENT NO. : 5,933,855
DATED : August 3, 1999
INVENTOR(S) : Rubinstein

It is certified that error appears in the above-identified patent and that said Letters Patent is hereby corrected as shown below:

Column 20,
Line 11, replace "providing source" with -- providing the data source --.
Line 20, replace "comprising input" with -- comprising output --.

Signed and Sealed this

Second Day of May, 2006

JON W. DUDAS
*Director of the United States Patent and Trademark Office*